US011189722B2

(12) United States Patent
Saitoh et al.

(10) Patent No.: US 11,189,722 B2
(45) Date of Patent: Nov. 30, 2021

(54) SEMICONDUCTOR DEVICE

(71) Applicant: SUMITOMO ELECTRIC INDUSTRIES, LTD., Osaka (JP)

(72) Inventors: Yu Saitoh, Osaka (JP); Takeyoshi Masuda, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/042,401

(22) PCT Filed: Mar. 14, 2019

(86) PCT No.: PCT/JP2019/010663
§ 371 (c)(1),
(2) Date: Sep. 28, 2020

(87) PCT Pub. No.: WO2019/198416
PCT Pub. Date: Oct. 17, 2019

(65) Prior Publication Data
US 2021/0143273 A1 May 13, 2021

(30) Foreign Application Priority Data
Apr. 13, 2018 (JP) .............................. JP2018-077461

(51) Int. Cl.
H01L 29/78 (2006.01)
H01L 29/06 (2006.01)
H01L 29/16 (2006.01)
(52) U.S. Cl.
CPC ...... H01L 29/7813 (2013.01); H01L 29/0619 (2013.01); H01L 29/1608 (2013.01)

(58) Field of Classification Search
CPC ............. H01L 29/7813; H01L 29/0619; H01L 29/1608
USPC .......................................................... 257/77
See application file for complete search history.

(56) References Cited

U.S. PATENT DOCUMENTS 9,276,105 B2    3/2016  Yamada et al.
2013/0069065 A1*  3/2013  Mauder ............... H01L 29/7813
                                                    257/51
2018/0040688 A1  2/2018  Kobayashi et al.

FOREIGN PATENT DOCUMENTS

JP    2013-051434    3/2013
JP    2014-086483    5/2014
JP    2015-076592    4/2015
(Continued)

Primary Examiner — Igwe U Anya
(74) Attorney, Agent, or Firm — IPUSA, PLLC

(57) ABSTRACT

A semiconductor device includes a first layer of first conductivity type and including an element region where semiconductor elements are to be formed, an annular second layer of second conductivity type formed to include a surface of the first layer, and surrounding the element region in a plan view, a third layer of second conductivity type formed in the first layer and separated more from the surface than the second layer, and sandwiching a portion of the first layer between the second and third layers, a fourth layer of second conductivity type and electrically connecting the second and third layers, and an electrode electrically connected to the fourth layer inside the second layer in the plan view. effective concentration of a second conductivity type impurity included in the second layer is higher than that of the first layer, and lower than that of the third layer.

15 Claims, 32 Drawing Sheets

(56) References Cited

FOREIGN PATENT DOCUMENTS

| JP | 2017-152732 | 8/2017 |
|---|---|---|
| JP | 2018-022851 | 2/2018 |

\* cited by examiner

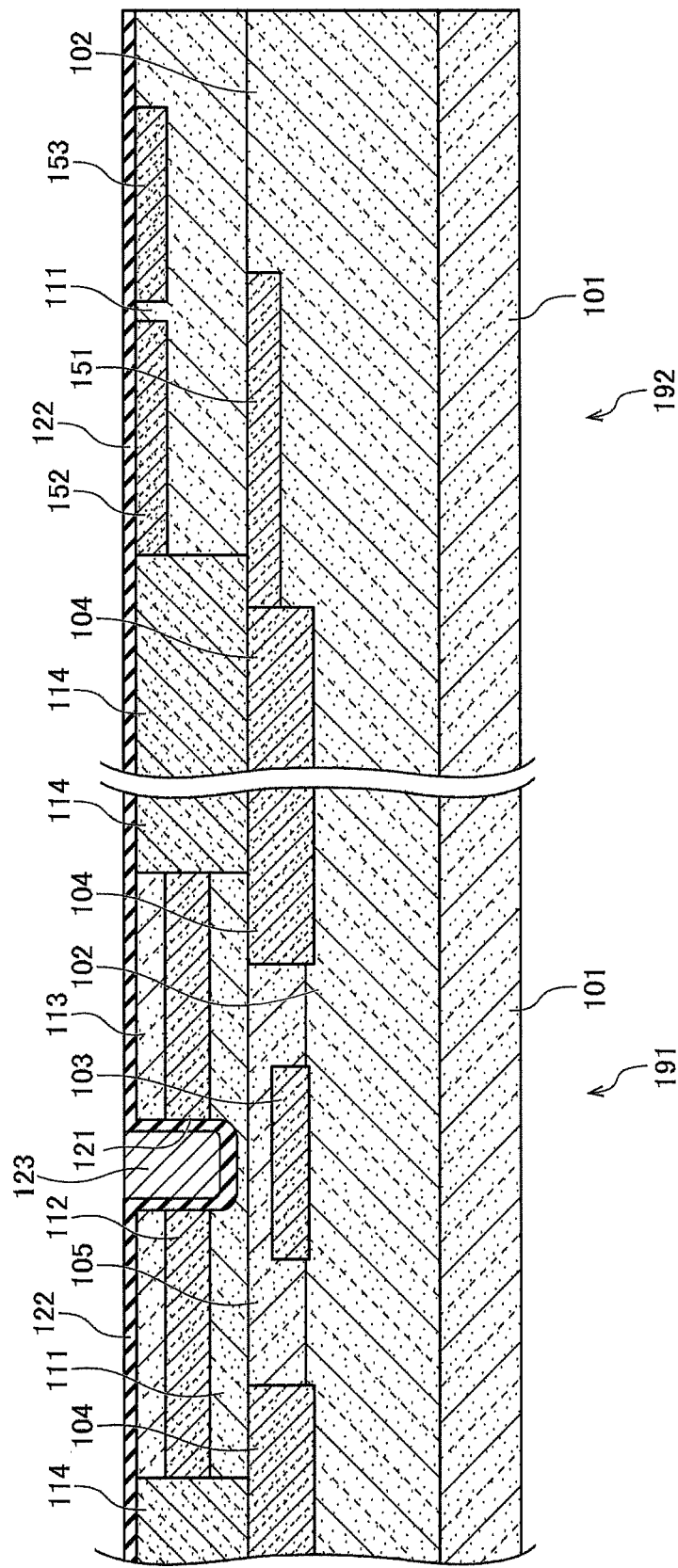

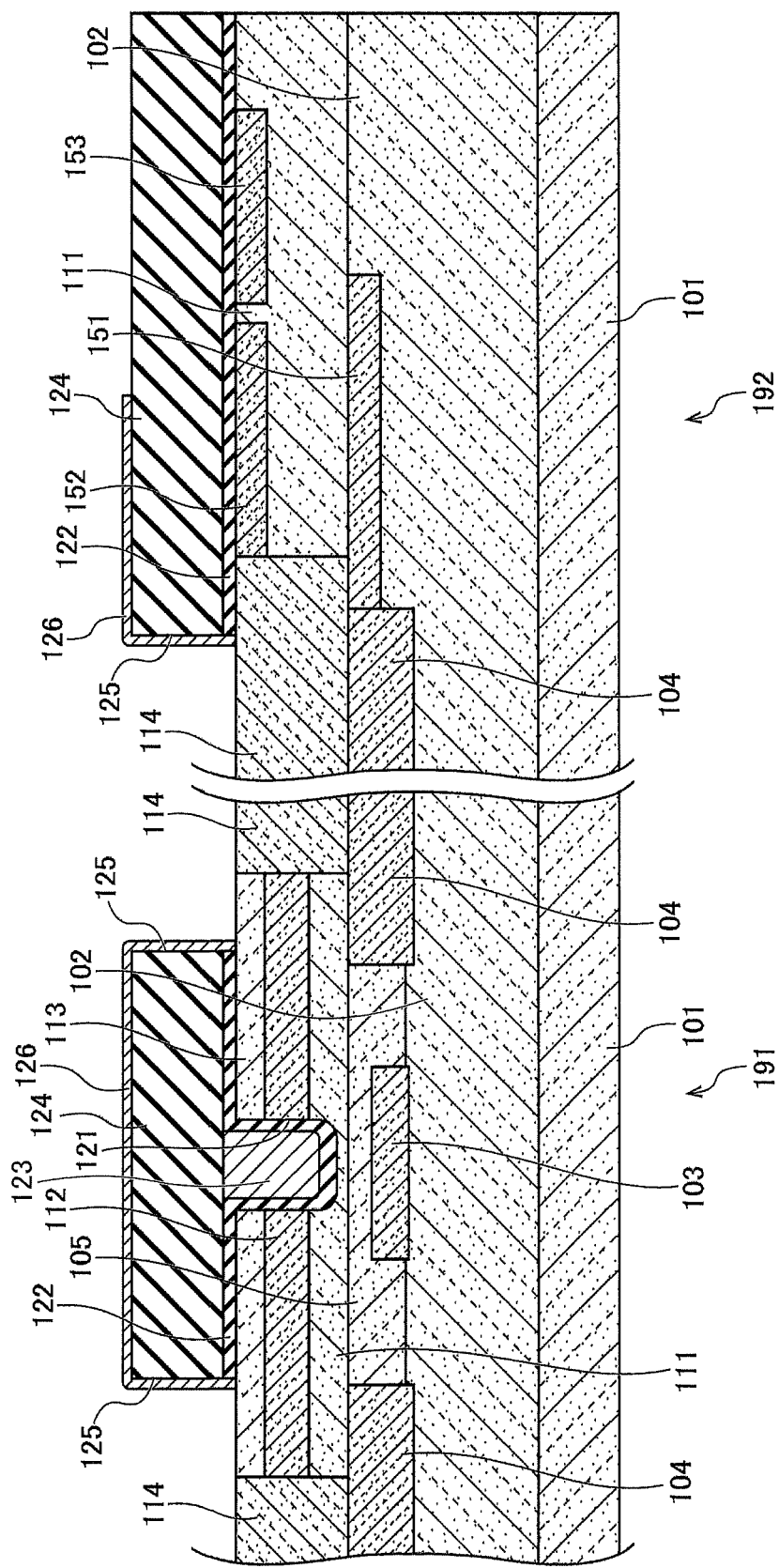

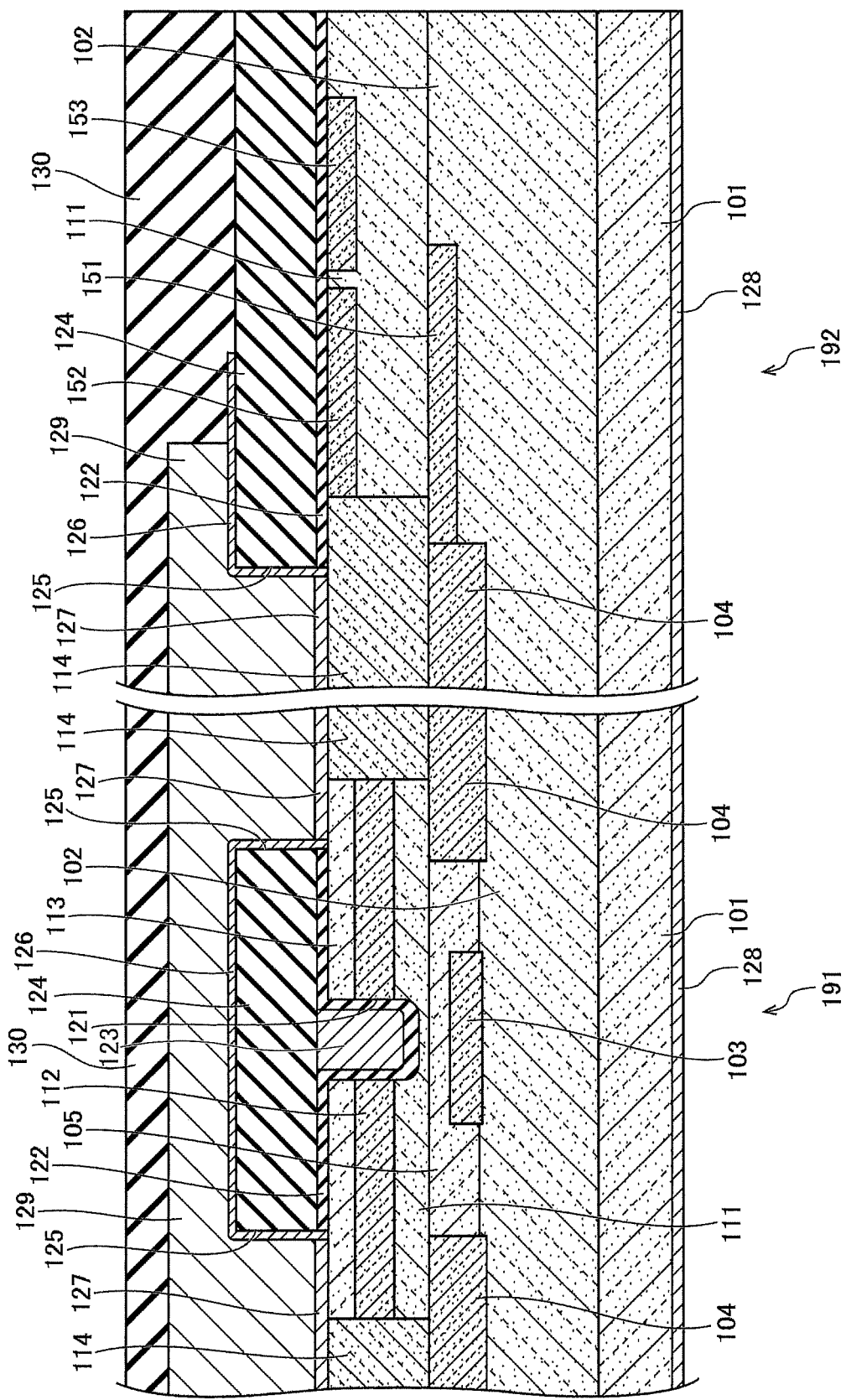

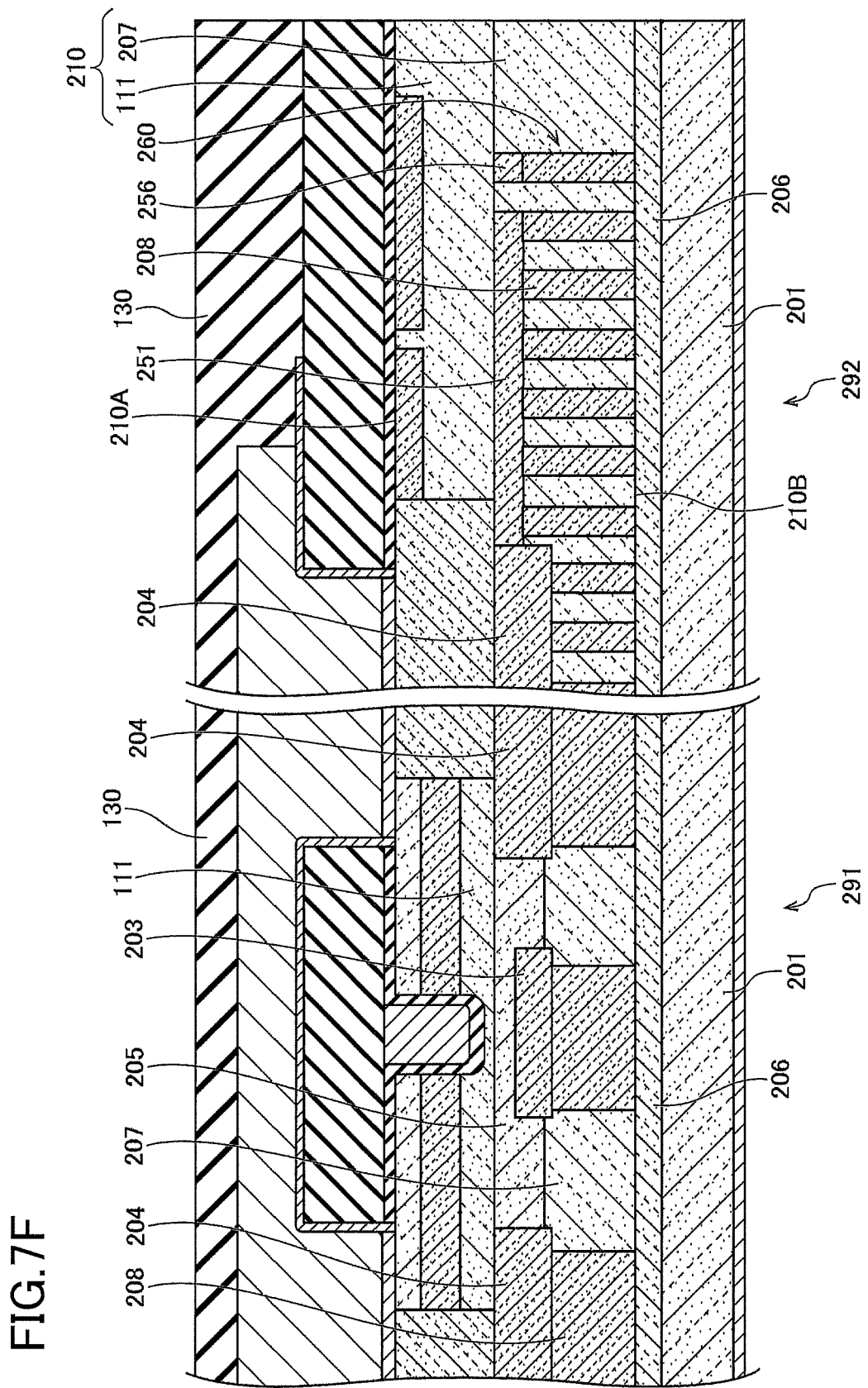

SEMICONDUCTOR DEVICE

TECHNICAL FIELD

The present disclosure relates to a semiconductor device.

This application is based upon and claims priority to Japanese Patent Application No. 2018-077461, filed on Apr. 13, 2018, the entire contents of which are incorporated herein by reference.

BACKGROUND ART

A terminating structure may be used in semiconductor devices suitable for high voltage applications, such as PN junction diodes, Schottky barrier diodes, metal-oxide-semiconductor field-effect transistors (MOSFETs), insulated gate bipolar transistors (IGBTs), or the like. Known terminating structures include a reduced surface field (RESURF) structure, a guard ring structure, or the like (for example, Patent Document 1). By using an appropriate terminating structure, it is possible to reduce electric field concentration at a terminating portion, and reduce deterioration of a withstand voltage.

PRIOR ART DOCUMENT

Patent Document

Patent Document 1: Japanese Laid-Open Patent Publication No. 2014-86483

DISCLOSURE OF THE INVENTION

According to one aspect of the embodiments, a semiconductor device includes a first semiconductor layer that is a first conductivity type and includes an element region where a plurality of semiconductor elements are to be formed; an annular second semiconductor layer that is a second conductivity type, formed to include a first surface of the first semiconductor layer, and surrounds the element region in a plan view; a third semiconductor layer that is the second conductivity type, formed in the first semiconductor layer and separated more from the first surface than the second semiconductor layer, and sandwiches a portion of the first semiconductor layer between the second semiconductor layer and the third semiconductor layer; a fourth semiconductor layer that is the second conductivity type and electrically connects the second semiconductor layer and the third semiconductor layer to each other; and a first electrode electrically connected to the fourth semiconductor layer inside the second semiconductor layer in the plan view. An effective concentration of a second conductivity type impurity included in the second semiconductor layer is higher than an effective concentration of a first conductivity type impurity included in the first semiconductor layer, and an effective concentration of the second conductivity type impurity included in the third semiconductor layer is higher than the effective concentration of the second conductivity type impurity included in the second semiconductor layer.

BRIEF DESCRIPTION OF THE DRAWINGS

FIG. 3L is a cross sectional view (part 12) illustrating the method of manufacturing the semiconductor device according to the first embodiment.

FIG. 3O is a cross sectional view (part 15) illustrating the method of manufacturing the semiconductor device according to the first embodiment.

FIG. 3R is a cross sectional view (part 18) illustrating the method of manufacturing the semiconductor device according to the first embodiment.

FIG. 7F is a cross sectional view (part 6) illustrating the method of manufacturing the semiconductor device according to the second embodiment.

MODE OF CARRYING OUT THE INVENTION

Figure 1:
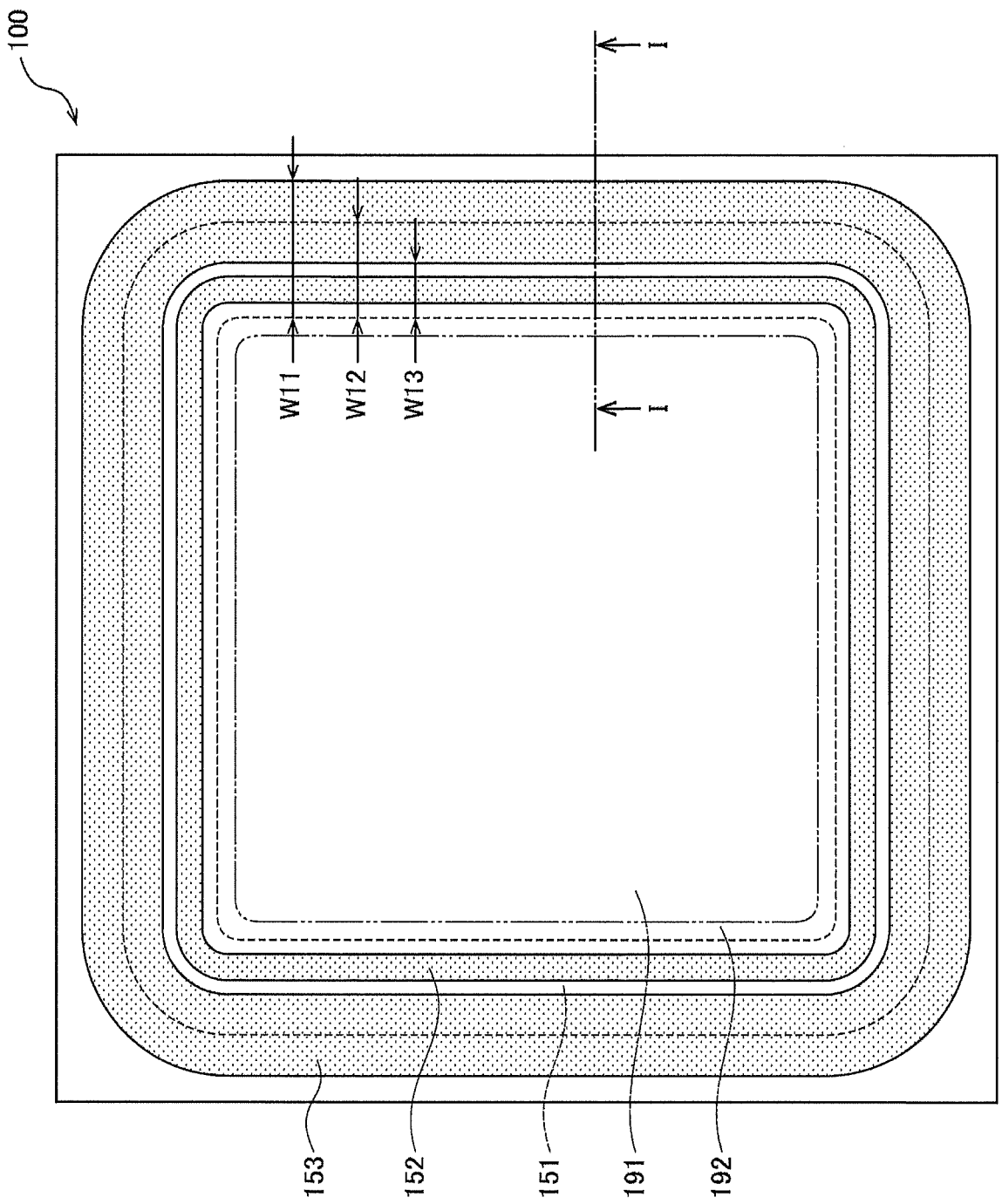
FIG. 1 is a diagram illustrating a layout of layers included in a semiconductor device according to a first embodiment.

When a semiconductor layer having a high impurity concentration is used to reduce a resistance of a current path, depletion of a terminating structure tends to become inhibited. In other words, conventionally, the reduction in the resistance of the current path, and the improvement in the withstand voltage of the terminating structure, are in a tradeoff relationship, and it is difficult to simultaneously reduce the resistance of the current path and improve the withstand voltage of the terminating structure.

Accordingly, one object of the present disclosure is to provide a semiconductor device capable of simultaneously reducing the resistance of the current path and improving the withstand voltage of the terminating structure.

According to the present disclosure, it is possible to simultaneously reduce the resistance of the current path, and improve the withstand voltage of the terminating structure.

Embodiments will be described in the following.

Description of Embodiments of Present Disclosure

Embodiments of the present disclosure will first be described in the following. In the following description, the same or corresponding elements are designated by the same reference numerals, and a description of the same or corresponding elements will not be repeated.

[1] A semiconductor device according to one aspect of the present disclosure includes a first semiconductor layer that is a first conductivity type and includes an element region where a plurality of semiconductor elements are to be formed; an annular second semiconductor layer that is a second conductivity type, formed to include a first surface of the first semiconductor layer, and surrounds the element region in a plan view; a third semiconductor layer that is the second conductivity type, formed in the first semiconductor layer and separated more from the first surface than the second semiconductor layer, and sandwiches a portion of the first semiconductor layer between the second semiconductor layer and the third semiconductor layer; a fourth semiconductor layer that is the second conductivity type and electrically connects the second semiconductor layer and the third semiconductor layer to each other; and a first electrode electrically connected to the fourth semiconductor layer inside the second semiconductor layer in the plan view, wherein an effective concentration of a second conductivity type impurity included in the second semiconductor layer is higher than an effective concentration of a first conductivity type impurity included in the first semiconductor layer, and wherein an effective concentration of the second conductivity type impurity included in the third semiconductor layer is higher than the effective concentration of the second conductivity type impurity included in the second semiconductor layer.

When the impurity concentration of the first semiconductor layer is high, the resistance in the element region can be reduced, but when a reverse bias is applied between the first electrode and a second electrode, an electric field may be concentrated at an end portion of the second semiconductor layer in a case where the third semiconductor layer is not included. On the other hand, in a case where the third semiconductor layer is included, even when the reverse bias is applied, a depletion layer is generated at an interface of the first semiconductor layer with the second semiconductor layer and at an interface of the first semiconductor layer with the third semiconductor layer, at a portion where the first semiconductor layer is sandwiched between the second semiconductor layer and the third semiconductor layer, thereby promoting depletion of the first semiconductor layer. Accordingly, even when the impurity concentration of the first semiconductor layer is high, the electric field concentration at the end portion of the second semiconductor layer is reduced, thereby enabling an excellent withstand voltage to be obtained.

[2] The second semiconductor layer includes a first annular layer that is electrically connected to the fourth semiconductor layer, and a second annular layer that is formed at a position separated from the first annular layer and surrounding the first annular layer in the plan view. Even when the impurity concentration of the second semiconductor layer is high, a leakage current caused by a flow of carriers can be reduced.

[3] In the plan view, an outer edge of the third semiconductor layer is positioned on the side closer to the element region than an outer edge of the second semiconductor layer. The second semiconductor layer reduces the electric field concentration at the end portion of the third semiconductor layer, and the withstand voltage is improved.

[4] The semiconductor device includes a fifth semiconductor layer that is the second conductivity type and formed below the fourth semiconductor layer when the third semiconductor layer is positioned below the second semiconductor layer when viewed from above the second semiconductor layer, and in the plan view, an outer edge of the fifth semiconductor layer is positioned on the side closer to the element region than an outer edge of the fourth semiconductor layer. The depletion layer easily spreads on the side of the first semiconductor layer, and the electric field concentration at the end portion of the fifth semiconductor layer can be reduced, thereby improving the withstand voltage.

[5] The semiconductor device includes an insulating film that covers the first semiconductor layer, and the first electrode includes a field plate portion covering a portion of the second semiconductor layer on the insulating film. The field plate portion can reduce the electric field concentration at the end portion of the second semiconductor layer and improve the withstand voltage.

[6] When the third semiconductor layer is positioned below the second semiconductor layer when viewed from the second semiconductor layer is downward, the second semiconductor layer includes a first region that is positioned below an end portion of the field plate portion, and includes the second conductivity type impurity with a first effective concentration, and a second region that is positioned on the side closer to an end portion of the second semiconductor layer than the first region, and includes the second conductivity type impurity with a second effective concentration lower than the first effective concentration. During a reverse bias application, depletion of the first region can be reduced, and the electric field concentration to the insulating film making contact with an end portion of the field plate portion can be reduced.

[7] According to another aspect of the present disclosure, a semiconductor device includes a first semiconductor layer that is a first conductivity type and includes an element region where a plurality of semiconductor elements are to be formed; an annular second semiconductor layer that is a second conductivity type, formed to include a first surface of the first semiconductor layer, and surrounds the element region in a plan view; a third semiconductor layer that is the second conductivity type, formed in the first semiconductor layer and separated more from the first surface than the second semiconductor layer, and sandwiches a portion of the first semiconductor layer between the second semiconductor layer and the third semiconductor layer; a fourth semiconductor layer that is the second conductivity type, and electrically connects the second semiconductor layer and the third semiconductor layer to each other; a first electrode that is electrically connected to the fourth semiconductor layer inside the second semiconductor layer in the plan view; and a plurality of columnar semiconductor layers that are the second conductivity type, formed in the first semiconductor layer, and form a super junction structure together with the first semiconductor layer, wherein, in a plan view, an outer edge of the third semiconductor layer is positioned on the side closer to the element region than an outer edge of the second semiconductor layer, wherein at least a portion of the plurality of columnar semiconductor layers is electrically connected to the third semiconductor layer, wherein an effective concentration of a second conductivity type impurity included in the second semiconductor layer is higher than an effective concentration of a first conductivity type impurity included in the first semiconductor layer, and wherein an effective concentration of the second conductivity type impurity included in the third semiconductor layer is higher than the effective concentration of the second conductivity type impurity included in the second semiconductor layer. Because the super junction structure is provided, the resistance of the current path can further be reduced.

[8] A portion of the plurality of columnar semiconductor layers is positioned outside the outer edge of the third semiconductor layer in the plan view, and is electrically independent of the third semiconductor layer. The electric field concentration at the end portion of the third semiconductor layer can be reduced, and the withstand voltage can be improved.

[9] The semiconductor device includes a SiC substrate that has a first principal surface, and a second principal surface on the opposite side from the first principal surface; and a second electrode that is formed on the second principal surface, wherein the first semiconductor layer is formed on the first principal surface. The semiconductor device can operate as a so-called vertical semiconductor device.

[10] According to yet another aspect of the present disclosure, a semiconductor device includes an n-type drift layer that includes an element region where a plurality of semiconductor elements are to be formed; an annular p-type junction termination extension layer that is formed to include a first surface of the drift layer, and surrounds the element region in a plan view; a p-type guard ring layer that is formed to include the first surface of the drift layer, at a position separated from the junction termination extension layer, and surrounds the junction termination extension layer in the plan view; a p-type embedded junction termination extension layer that is formed in the drift layer, at a position separated more from the first surface than the junction termination extension layer and the guard ring layer, and sandwiches a portion of the drift layer between the junction termination extension layer and the guard ring layer; a p-type contact layer that electrically connects the junction termination extension layer and the embedded junction termination extension layer to each other; a first electrode that is electrically connected to the contact layer inside the junction termination extension layer in the plan view; a SiC substrate that has a first principal surface, and a second principal surface on the side opposite from the first principal surface; and a second electrode that is formed on the second principal surface, wherein the drift layer is formed on the first principal surface, wherein, in the plan view, an outer edge of the embedded junction termination extension layer is positioned on the side closer to the element region than an outer edge of the guard ring layer, wherein effective concentrations of acceptor impurities included in the junction termination extension layer and the guard ring layer are higher than an effective concentration of a donor impurity included in the drift layer, and wherein an effective concentration of an acceptor impurity included in the embedded junction termination extension layer is higher than the effective concentrations of the acceptor impurities included in the junction termination extension layer and the guard ring layer.

DETAILS OF EMBODIMENTS OF PRESENT DISCLOSURE

Embodiments of the present disclosure will now be described in detail, however, the embodiments of the present disclosure are not limited to the embodiments described in the following.

First Embodiment

Figure 2A:
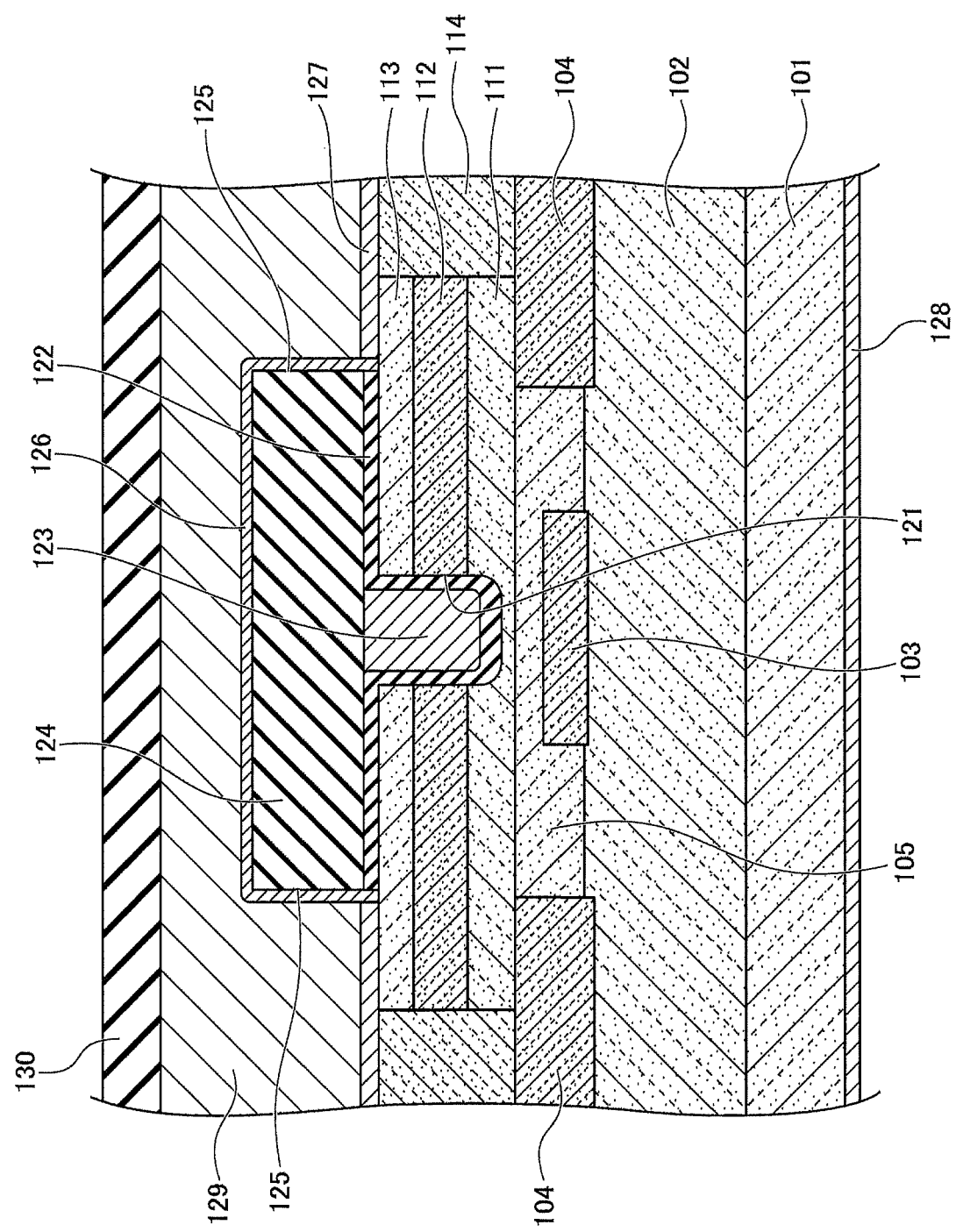
FIG. 2A is a cross sectional view illustrating a structure of an element region included in the semiconductor device according to the first embodiment.
Figure 2B:
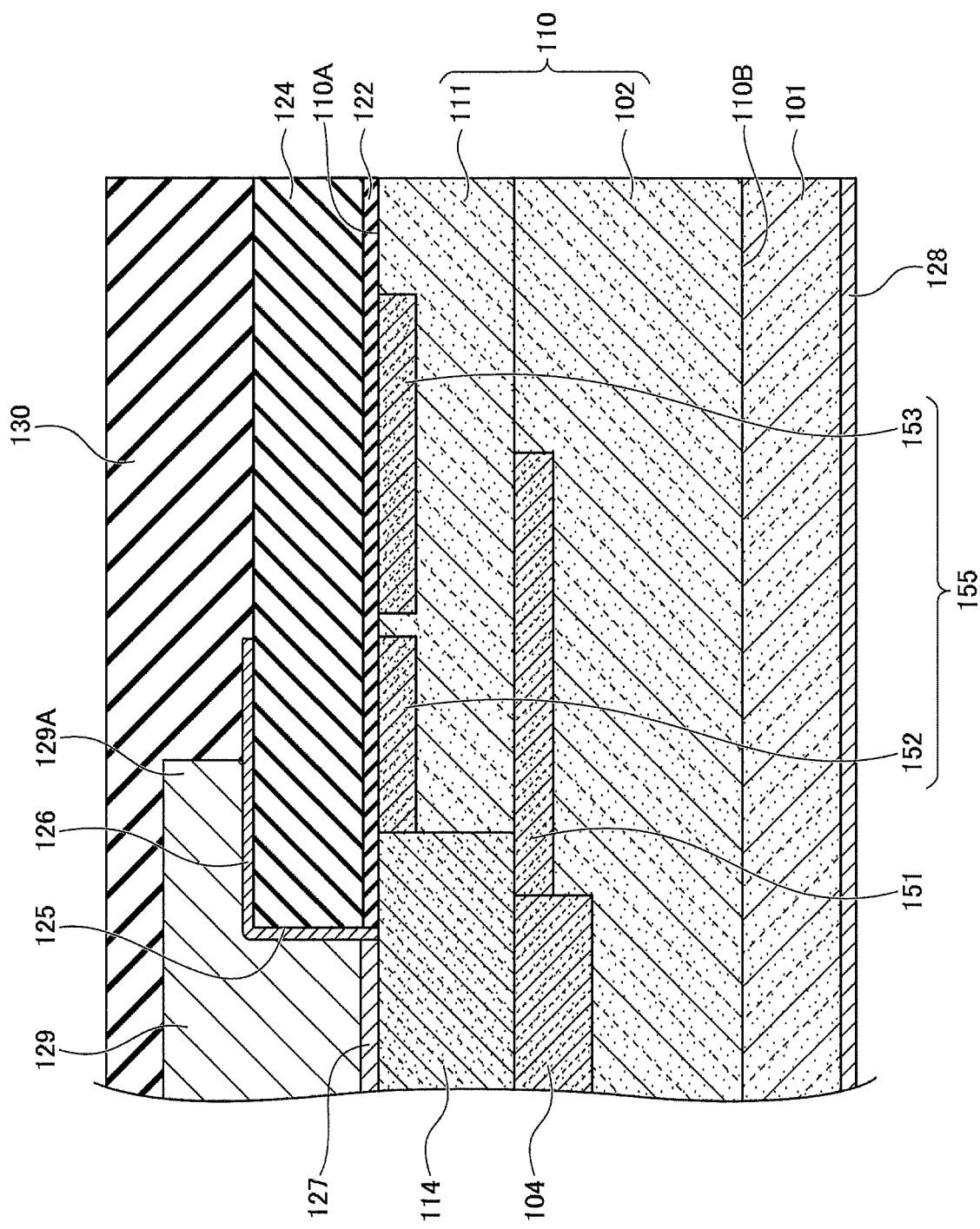
FIG. 2B is a cross sectional view illustrating a structure of a terminating region included in the semiconductor device according to the first embodiment.

First, a first embodiment will be described. The first embodiment relates to a semiconductor device having a plurality of trench SiC-MOSFETs having a withstand voltage of approximately 1.2 kV. FIG. 1 is a diagram illustrating a layout of layers included in the semiconductor device according to the first embodiment. FIG. 2A is a cross sectional view illustrating a structure of an element region included in the semiconductor device according to the first embodiment. FIG. 2B is a cross sectional view illustrating a structure of a terminating region included in the semiconductor device according to the first embodiment. FIG. 2B corresponds to a cross sectional view along a line I-I in FIG. 1. The scale in each of these figures is appropriately adjusted to facilitate recognition of each portion, and in particular, the scale along a horizontal reduction between the element region and the terminating region is not uniform. In addition, an end portion of the layer or the like, unless otherwise indicated, refers to the end portion of the layer or the like on the side separated from the element region of the layer or the like.

A semiconductor device 100 according to the first embodiment is a so-called vertical semiconductor device, including a source pad electrode 129 provided above a SiC substrate 101, and an ohmic electrode 128 for the drain, provided below the SiC substrate 101. The semiconductor device 100 includes an element region 191 having a plurality of semiconductor elements through which a current flows due to a voltage applied between the ohmic electrode 128 and the source pad electrode 129, and a terminating region 192 provided around the element region 191.

As illustrated in FIG. 1, FIG. 2A, and FIG. 2B, an n⁻ drift layer 102 is formed on the SiC substrate 101. The n⁻ drift layer 102 is a SiC layer having a thickness of 7 μm to 15 μm, for example, and includes nitrogen (N) as a donor impurity with an effective donor concentration of $3 \times 10^{15}$ cm⁻³ to $2 \times 10^{16}$ cm⁻³.

As illustrated in FIG. 2A, inside the element region 191, an n-type current spreading layer (CSL) 105 is formed on a surface of the n⁻ drift layer 102, a p-type shield region 103 is provided on the inside of the n-type current spreading layer 105, and a p-type shield region 104 is provided on the outside of the n-type current spreading layer 105, for each semiconductor device. The current spreading layer 105 includes phosphorus (P) as a donor impurity with an effective donor concentration of $1 \times 10^{16}$ cm⁻³ to $1 \times 10^{18}$ cm⁻³. The shield regions 103 and 104 include aluminum (Al) as an acceptor impurity with an effective acceptor concentration of $1 \times 10^{17}$ cm⁻³ to $5 \times 10^{18}$ cm⁻³.

In the present disclosure, the effective donor concentration is the difference between the impurity concentration of the donor element and the impurity concentration of the acceptor element, and the effective acceptor concentration is the difference between the impurity concentration of the acceptor element and the impurity concentration of the donor element. The effective donor concentration and the effective acceptor concentration can be measured according to the following procedures 1 to 4, for example.

(Procedure 1) The surface of the semiconductor device is observed to identify the element region.

(Procedure 2) The semiconductor device is processed so that the cross section of a semiconducting region illustrated in FIG. 2A appears. For example, a focused ion beam (FIB) apparatus is used to process the cross section of semiconductor device.

(Procedure 3) A scanning electron microscope (SEM) is used to determine whether the conductivity type of the region injected with the impurity is the p-type or the n-type. When the SEM observation is performed under a condition where an acceleration voltage is 3 kV and a magnification is 10,000 times, for example, a bright area is the p-type region and a dark area is the n-type region.

(Procedure 4) Scanning spreading resistance microscopy (SSRM) is used to measure the impurity concentration for the p-type region and the n-type region in cross section described above. The concentration of the p-type region is the effective acceptor concentration, and the concentration of the n-type region is the effective donor concentration.

As illustrated in FIG. 2B, the shield region 104 is formed to extend to the terminating region 192. At the terminating region 192, a p-type embedded junction termination extension (JTE) layer 151 is formed on the surface of the n⁻ drift layer 102 to electrically connect to the shield region 104. The embedded JTE layer 151 includes Al as the acceptor impurity with an effective acceptor concentration of $1 \times 10^{17}$ cm⁻³ to $5 \times 10^{18}$ cm⁻³. The embedded JTE layer 151 is an example of a third semiconductor layer, and the shield region 104 is an example of a fifth semiconductor layer.

As illustrated in FIG. 2A and FIG. 2B, an n⁺ drift layer 111 is formed on the n⁻ drift layer 102 at the element region 191 and the terminating region 192. The n⁺ drift layer 111 is a SiC layer having a thickness of 1 μm to 3 μm, for example, and includes N as a donor impurity with an effective donor concentration of $1 \times 10^{16}$ cm⁻³ to $1 \times 10^{17}$ cm⁻³. The n⁻ drift layer 102 and the n⁺ drift layer 111 are included in an n-type first semiconductor layer 110.

As illustrated in FIG. 2A, at element region 191, a p-type body layer 112 is formed on a surface of the n⁺ drift layer 111, that is, on a first surface 110A of the first semiconductor layer 110, and an n⁺ source contact layer 113 is formed on a surface of the body layer 112. In addition, for each semiconductor device, a p⁺ source contact layer 114 is formed on the n⁺ drift layer 111, the body layer 112, and the n⁺ source contact layer 113, on the shield region 104. The body layer 112 includes Al as an acceptor impurity with an effective acceptor concentration of $1 \times 10^{17}$ cm⁻³ to $5 \times 10^{18}$ cm⁻³. The n⁺ source contact layer 113 includes P as a donor impurity with an effective donor concentration of $1 \times 10^{18}$ cm⁻³ to $1 \times 10^{19}$ cm⁻³. The p⁺ source contact layer 114 includes Al as an acceptor impurity with an effective acceptor concentration of $1 \times 10^{19}$ cm⁻³ to $5 \times 10^{20}$ cm⁻³.

As illustrated in FIG. 2B, the p⁺ source contact layer 114 is formed to extend to the terminating region 192. An end portion of the p⁺ source contact layer 114 is positioned on the outside of an end portion of the shield region 104. In the terminating region 192, a p-type junction termination extension (JTE) layer 152 is formed on the surface of the n⁺ drift layer 111 to electrically connect to the p⁺ source contact layer 114, and a p-type guard ring layer 153 is formed around the JTE layer 152. An end portion of the guard ring layer 153 is positioned on the outside of an end portion of the embedded JTE layer 151. The JTE layer 152 includes Al as an acceptor impurity with an effective acceptor concentration of $1 \times 10^{17}$ cm⁻³ to $5 \times 10^{18}$ cm⁻³. The guard ring layer 153 includes Al as an acceptor impurity with an effective acceptor concentration of $1 \times 10^{17}$ cm⁻³ to $5 \times 10^{18}$ cm⁻³. The effective acceptor concentrations of the JTE layer 152 and the guard ring layer 153 may match or differ, and in case where the effective acceptor concentrations differ, the effective acceptor concentration of the guard ring layer 153 is preferably lower than the effective acceptor concentration of the JTE layer 152. This is because depletion is promoted even at a low voltage. The JTE layer 152 and the guard ring layer 153 are included in a p-type second semiconductor layer 155. The p⁺ source contact layer 114 is an example of a fourth semiconductor layer, the JTE layer 152 is an example of a first annular layer, and the guard ring layer 153 is an example of a second annular layer.

As illustrated in FIG. 2A, at the element region 191, a trench 121 for the gate is formed in the n⁺ source contact layer 113, the body layer 112, and the n⁺ drift layer 111. In addition, a gate insulating film 122 is formed on a top surface of the n⁺ drift layer 111, and on a side surface and a bottom surface of the trench 121, and a gate electrode 123 is formed on the gate insulating film 122 within the trench 121. For example, the gate insulator 122 includes a silicon oxide, and the gate electrode 123 is made of a conductive material, such as a polycrystalline silicon (polysilicon) or the like including an impurity.

As illustrated in FIG. 2A and FIG. 2B, at the element region 191 and the terminating region 192, an interlayer insulator 124 is formed on the gate insulating film 122 and the gate electrode 123, and an opening 125, that exposes the n⁺ source contact layer 113 and the p⁺ source contact layer 114, is formed in the interlayer insulator 124. The opening 125 is formed to extend to the terminating region 192. An opening, that exposes the gate electrode 123 but is not illustrated, is also formed in the interlayer insulator 124. For example, the interlayer insulator 124 includes a silicon oxide.

A barrier metal film 126 is formed to cover a top surface and a side surface of the interlayer insulator 124. An ohmic electrode 127 is formed on portions of the n$^+$ source contact layer 113 and the p$^+$ source contact layer 114 exposed from the opening 125, and the ohmic electrode 128 for the drain is formed on a back surface of the SiC substrate 101. In other words, the ohmic electrode 128 is formed below the second surface 110B on the opposite side from the first surface 110A of the first semiconductor layer 110. A source pad electrode 129 is formed on the barrier metal film 126 and the ohmic electrode 127, and a passivation film 130 is formed on the interlayer insulator 124 so as to cover the source pad electrode 129. For example, the barrier metal film 126 is made of a titanium nitride, the ohmic electrode 128 is made of nickel, the source pad electrode 129 is made of aluminum, and the passivation film 130 includes a silicon nitride or a polyimide.

Hence, in the semiconductor device 100 according to the first embodiment, an annular p-type second semiconductor layer 155, surrounding the element region 191 in a plan view, is formed on the first surface 110A of the n-type first semiconductor layer 110. The first semiconductor layer 110 includes the n$^-$ drift layer 102 and the n$^+$ drift layer 111, and the second semiconductor layer 155 includes the JTE layer 152 and the guard ring layer 153. In addition, the p-type embedded JTE layer 151 is also formed on the surface of the n$^-$ drift layer 102. The p-type embedded JTE layer 151 and the JTE layer 152 are electrically connected to each other by the p$^+$ source contact layer 114. The p$^+$ source contact layer 114 is formed on the n$^+$ drift layer 111, and the n$^+$ drift layer 111 is sandwiched between the second semiconductor layer 155 (JTE layer 152 and guard ring layer 153) and the embedded JTE layer 151 along a depth direction.

In addition, when attention is drawn to the impurity concentration, the effective donor concentration of the n$^+$ drift layer 111 is higher than the effective donor concentration of the n$^-$ drift layer 102, and the effective donor concentration of each of the n$^+$ drift layer 111 and the n$^-$ drift layer 102 is lower than the effective acceptor concentration of the p$^+$ source contact layer 114. Both the JTE layer 152 and the guard ring layer 153 have an effective acceptor concentration lower than the effective acceptor concentration of the embedded JTE layer 151, and the effective acceptor concentration of the embedded JTE layer 151 is lower than the effective acceptor concentration of the p$^+$ source contact layer 114.

In the semiconductor device 100 having the above described structure, when a reverse bias is applied between the source pad electrode 129 and the ohmic electrode 128, the depletion of the n$^+$ drift layer 111 is promoted not only by the JTE layer 152 and the guard ring layer 153, but also by the embedded JTE layer 151. For this reason, the electric field concentration at the end portions of the JTE layer 152 and the guard ring layer 153 can be reduced, thereby improving the withstand voltage.

Moreover, the end portion of the embedded JTE layer 151 is positioned on the inside of the end portion of the guard ring layer 153, and in the plan view, an outer edge of the embedded JTE layer 151 is positioned on the side closer to the element region 191 than an outer edge of the second semiconductor layer 155. For this reason, the electric field concentration at the end portion of the embedded JTE layer 151 can also be reduced.

Further, the second semiconductor layer 155 is not formed of a single layer, but includes the annular JTE layer 152 electrically connected to the p$^+$ source contact layer 114, and the annular guard ring layer 153, separated from the JTE layer 152, and surrounding the JTE layer 152 in the plan view. For this reason, even when the impurity concentration of the second semiconductor layer 155 is high, a leakage current caused by the flow of carriers can be reduced.

In addition, the end portion of the shield region 104 below the p$^+$ source contact layer 114 is positioned on the inside of the end portion of the p$^+$ source contact layer 114, and in the plan view, an outer edge of the shield region 104 is positioned on the side closer to the element region 191 than an outer edge of the p$^+$ source contact layer 114. For this reason, the depletion layer more easily spreads to the side of the first semiconductor layer 110, and the electric field concentration at the end portion of the shield region 104 can be reduced. Further, the embedded JTE layer 151 functions as a field plate with respect to the end portion of the p$^+$ source contact layer 114 and the end portion of the shield region 104. For this reason, the embedded JTE layer 151 can also reduce the electric field concentration at the end portion of the p$^+$ source contact layer 114 and at the end portion of the shield region 104.

Moreover, a portion of the source pad electrode 129 on the interlayer insulator 124 covers a portion of the JTE layer 152, and this portion of the source pad electrode 129 functions as a field plate portion 129A. For this reason, the source pad electrode 129 can also reduce the electric field concentration at the end portion of the p$^+$ source contact layer 114 and at the end portion of the shield region 104.

For example, a distance W11 from an interface of the embedded JTE layer 151 with the shield region 104 to the end portion of the guard ring layer 153 is approximately four times to approximately five times the thickness of the first semiconductor layer 110. When the distance W11 is too long, the effect of improving the withstand voltage may saturate, while on the other hand, a ratio of the element region 191 with respect to the entire semiconductor device 100 may become too small, thereby increasing the resistance of the current path. When the distance W11 is too short, an excellent withstand voltage may not be obtained. In addition, for example, a distance W12 from the interface of the embedded JTE layer 151 with the shield region 104 to the end portion of the embedded JTE layer 151 is approximately ⅔ of the distance W11, and a distance W13 from the interface of the embedded JTE layer 151 with the shield region 104 to the edge of the element region 191 of the guard ring layer 153 is approximately ⅓ of the distance W11.

(Method of Manufacturing Semiconductor Device)

Figure 3A:
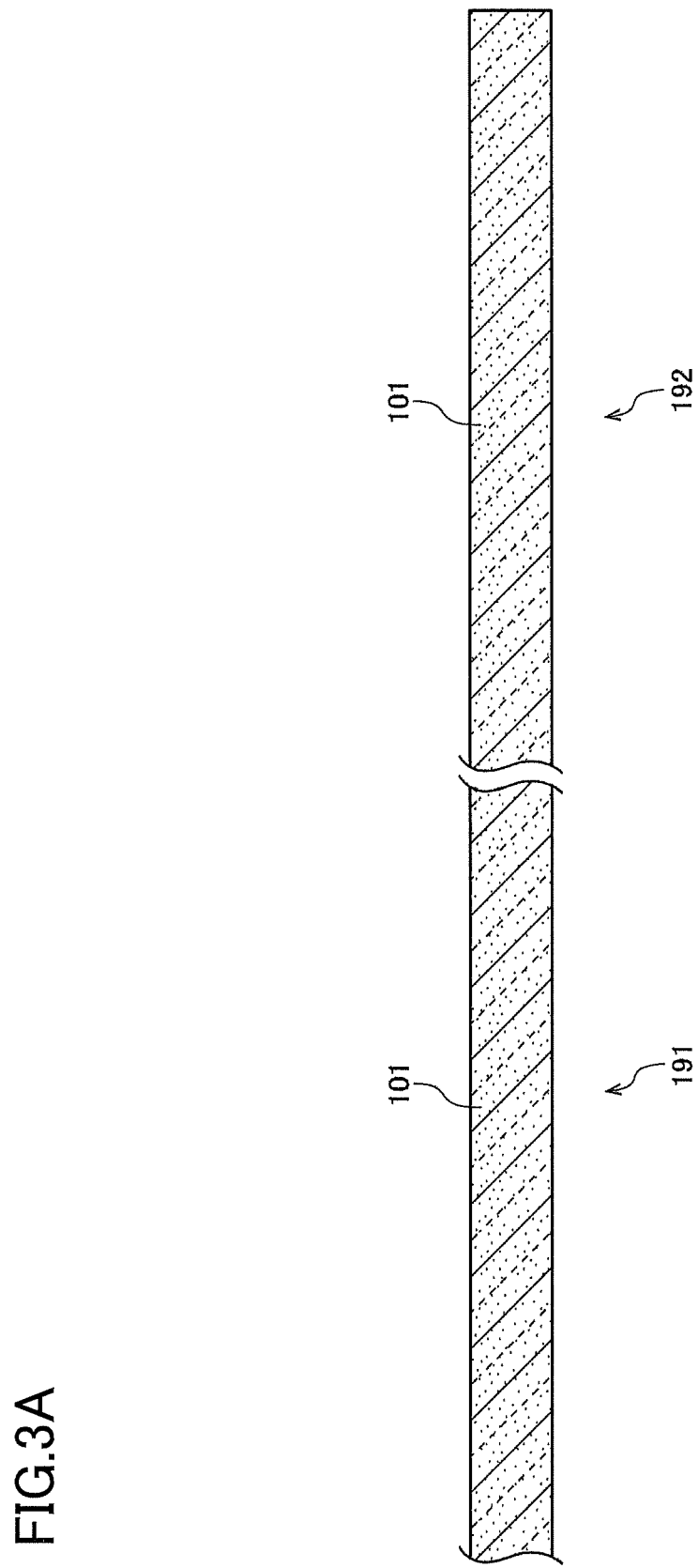
FIG. 3A is a cross sectional view (part 1) illustrating a method of manufacturing the semiconductor device according to the first embodiment.

Next, a method of manufacturing the semiconductor device 100 will be described. FIG. 3A through FIG. 3R are cross sectional views illustrating the method of manufacturing the semiconductor device 100 according to the first embodiment.

Figure 3B:
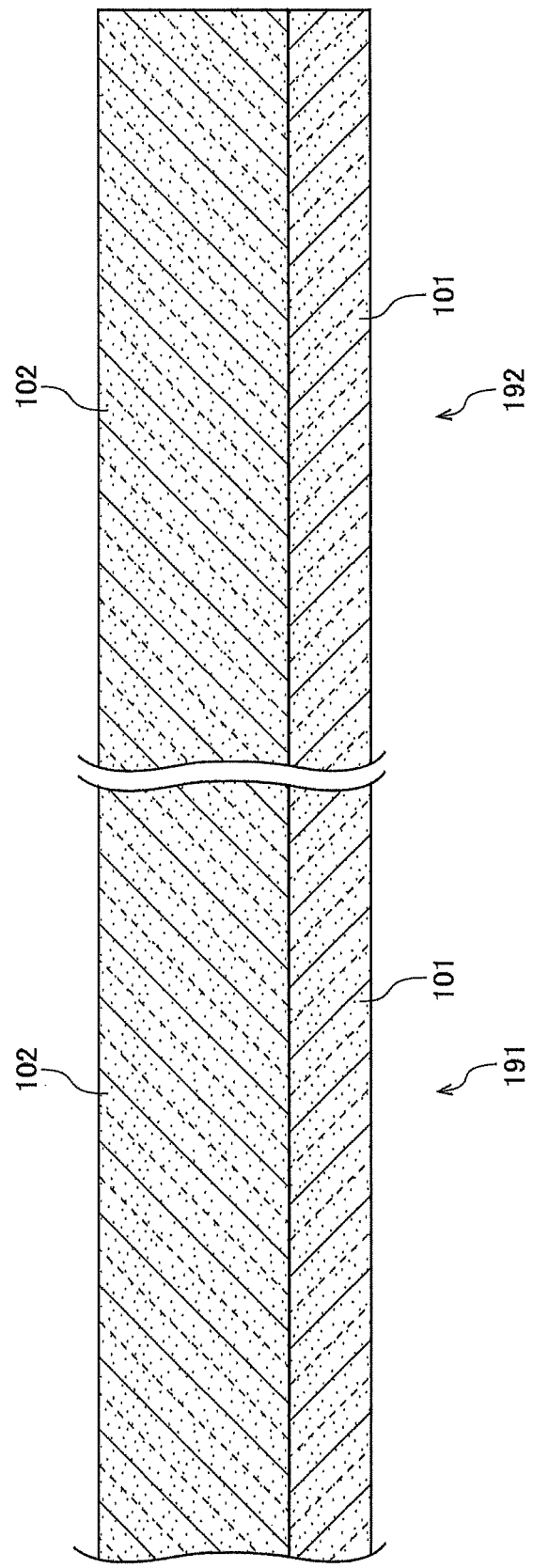
FIG. 3B is a cross sectional view (part 2) illustrating the method of manufacturing the semiconductor device according to the first embodiment.

First, as illustrated in FIG. 3A, the SiC substrate 101 is prepared. Then, as illustrated in FIG. 3B, the n$^-$ drift layer 102 is formed on the SiC substrate 101. For example, the n$^-$ drift layer 102 may be formed via epitaxial growth with added N.

Figure 3C:
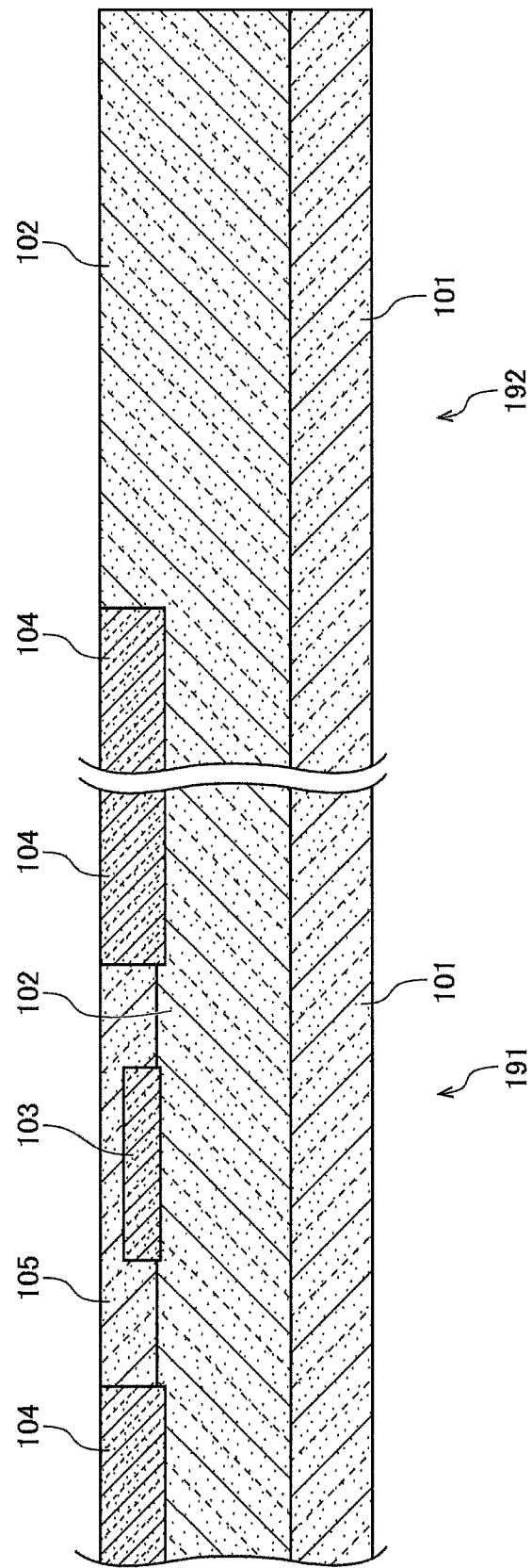
FIG. 3C is a cross sectional view (part 3) illustrating the method of manufacturing the semiconductor device according to the first embodiment.

Thereafter, as illustrated in FIG. 3C, in the element region 191, the p-type shield regions 103 and 104, and the n-type current spreading layer 105, are formed on the surface of n$^-$ drift layer 102. The shield region 104 is formed to extend to the terminating region 192. For example, the shield regions 103 and 104 may be formed via ion implantation of Al, and the current spreading layer 105 may be formed via ion implantation of P.

Figure 3D:
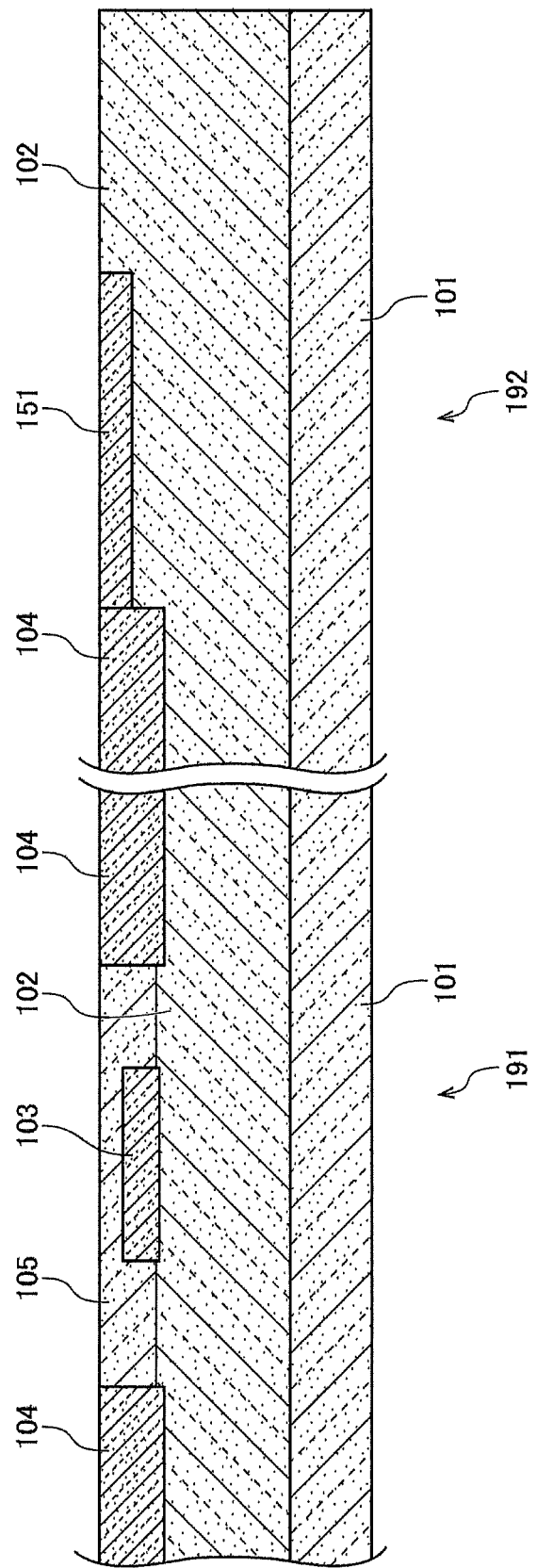
FIG. 3D is a cross sectional view (part 4) illustrating the method of manufacturing the semiconductor device according to the first embodiment.

Next, as illustrated in FIG. 3D, in the terminating region 192, the p-type embedded JTE layer 151 is formed on the surface of the n⁻ drift layer 102. For example, the embedded JTE layer 151 may be formed via ion implantation of Al. The embedded JTE layer 151 is formed to make electrical contact with the shield region 104.

Figure 3E:
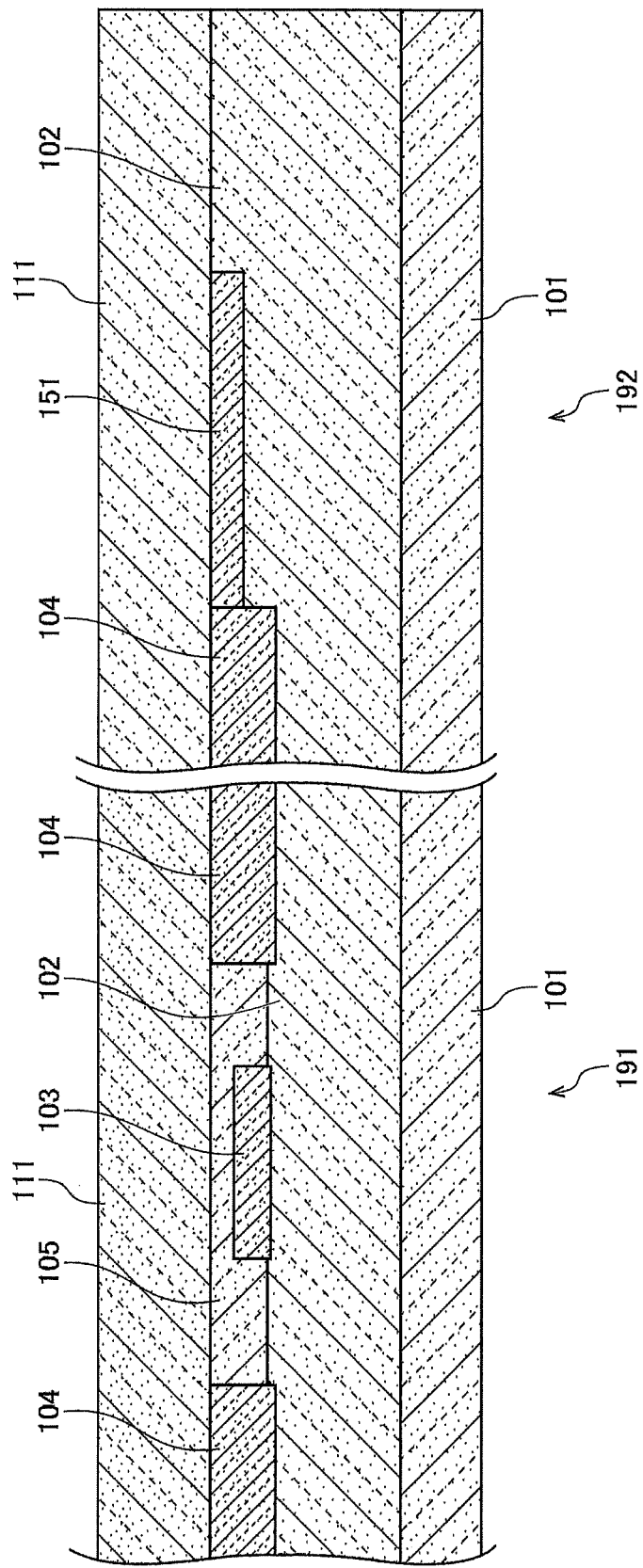
FIG. 3E is a cross sectional view (part 5) illustrating the method of manufacturing the semiconductor device according to the first embodiment.

Next, as illustrated in FIG. 3E, in the element region 191 and the terminating region 192, the n⁺ drift layer 111 is formed on the n⁻ drift layer 102. For example, the n⁺ drift layer 111 may be formed via epitaxial growth with added N.

Figure 3F:
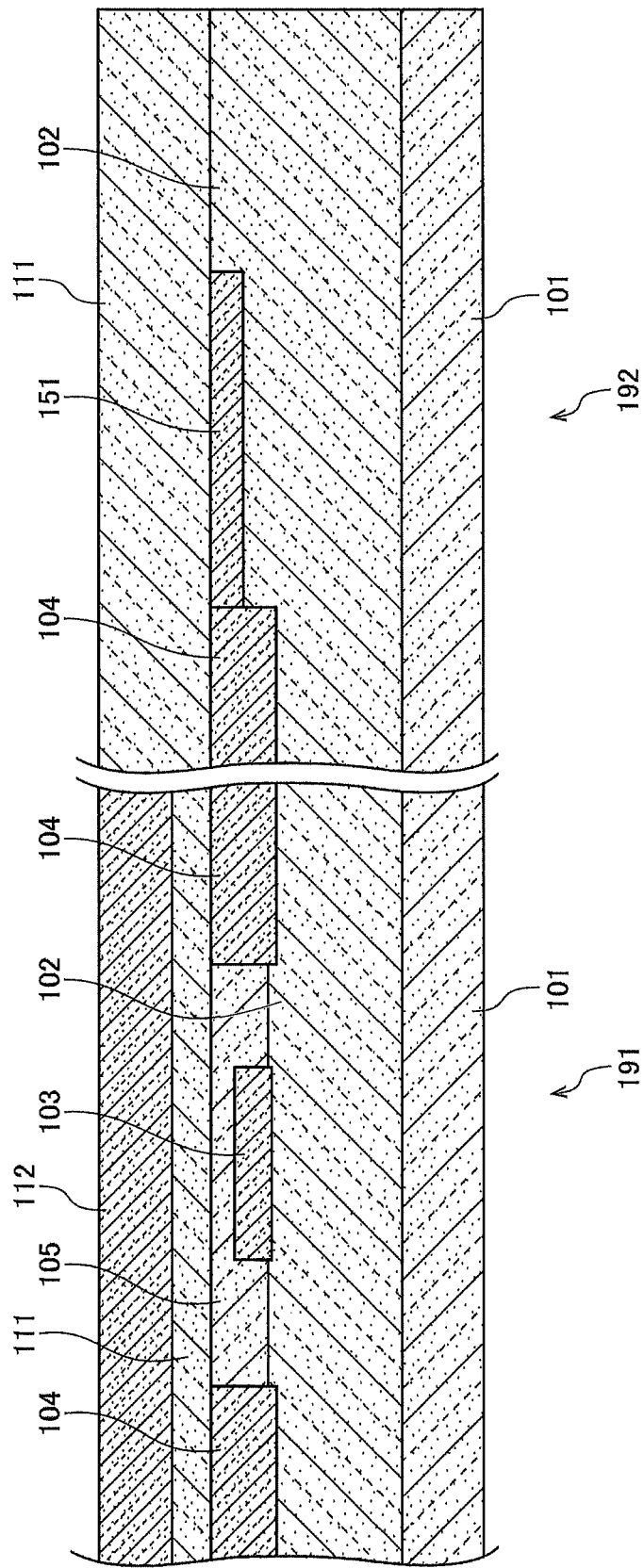
FIG. 3F is a cross sectional view (part 6) illustrating the method of manufacturing the semiconductor device according to the first embodiment.

Thereafter, as illustrated in FIG. 3F, in the element region 191, the p-type body layer 112 is formed on the surface of the n⁺ drift layer 111. For example, the body layer 112 may be formed via ion implantation of Al.

Figure 3G:
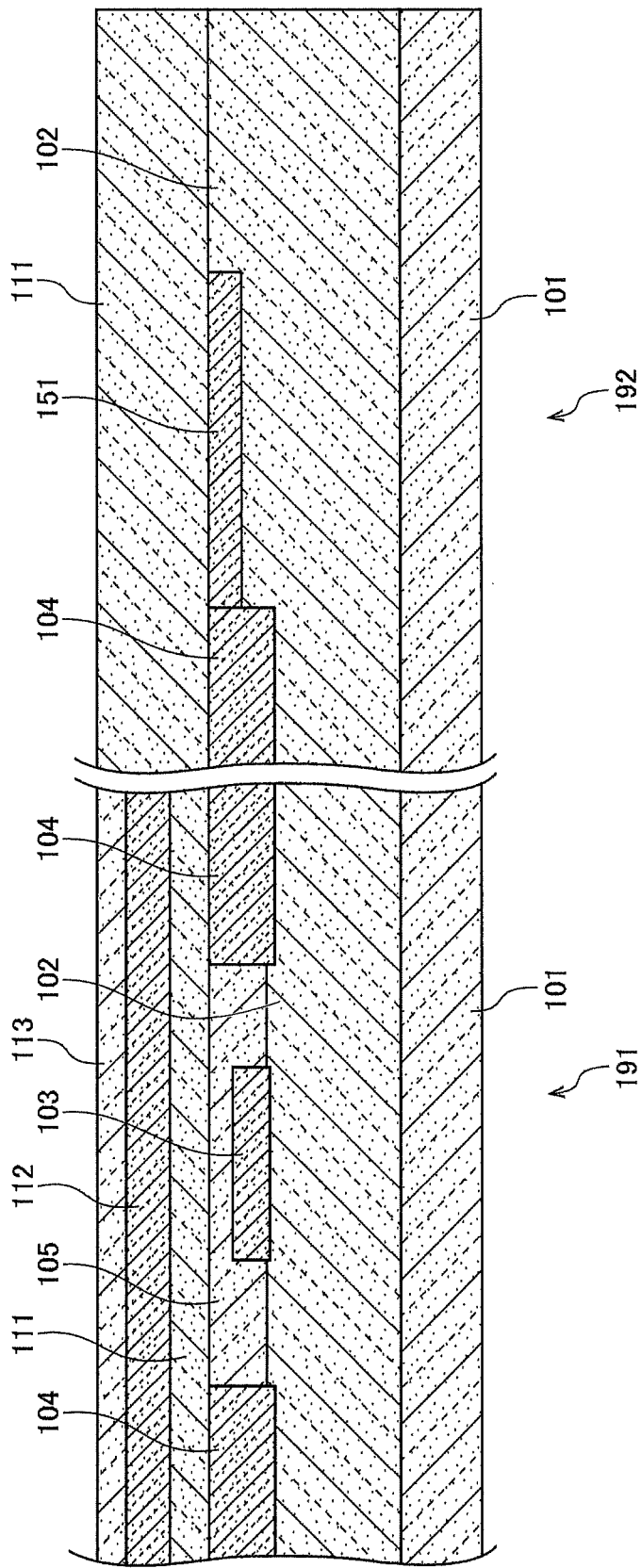
FIG. 3G is a cross sectional view (part 7) illustrating the method of manufacturing the semiconductor device according to the first embodiment.

Next, as illustrated in FIG. 3G, in the element region 191, the n⁺ source contact layer 113 is formed on the surface of the body layer 112. For example, n⁺ source contact layer 113 may be formed via ion implantation of P.

Figure 3H:
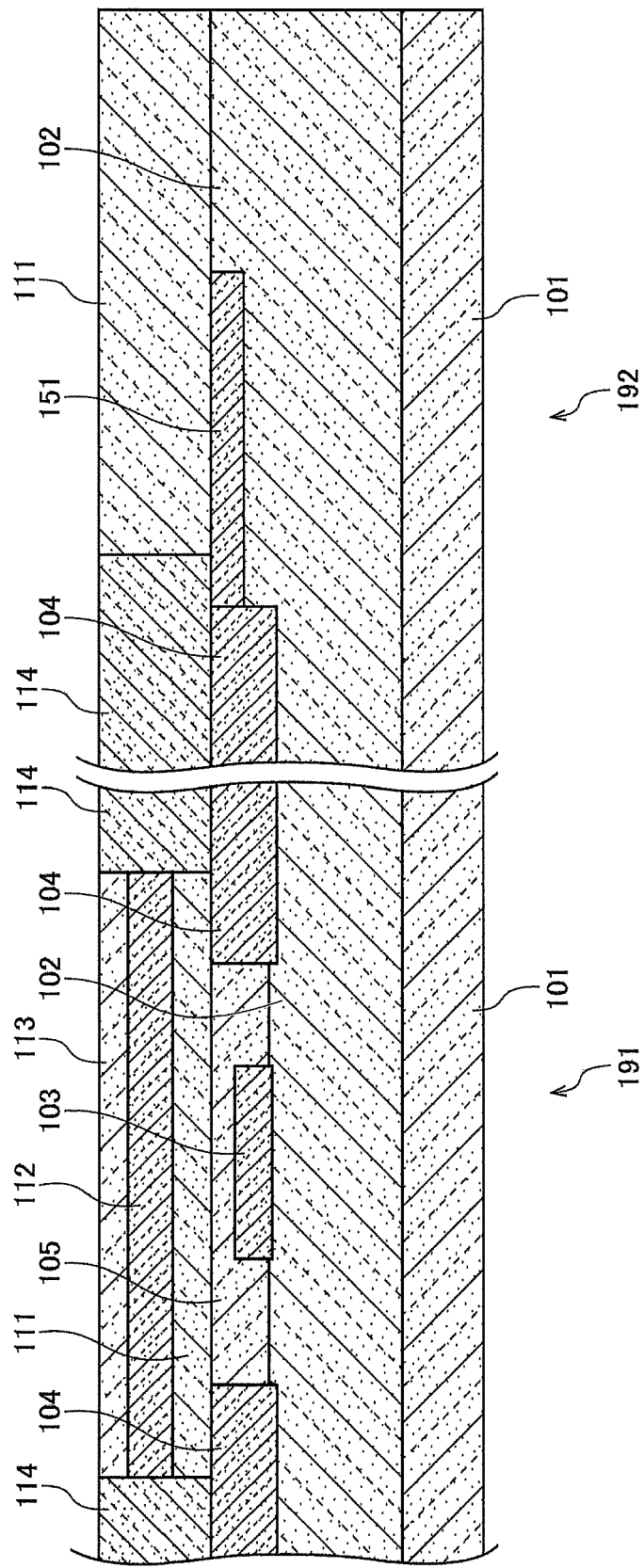
FIG. 3H is a cross sectional view (part 8) illustrating the method of manufacturing the semiconductor device according to the first embodiment.

Next, as illustrated in FIG. 3H, in the element region 191, the p⁺ source contact layer 114 is formed in the n⁺ source contact layer 113, the body layer 112, and the n⁺ drift layer 111. The p⁺ source contact layer 114 is formed to extend to the terminating region 192. For example, the p⁺ source contact layer 114 may be formed via ion implantation of Al.

Figure 3I:
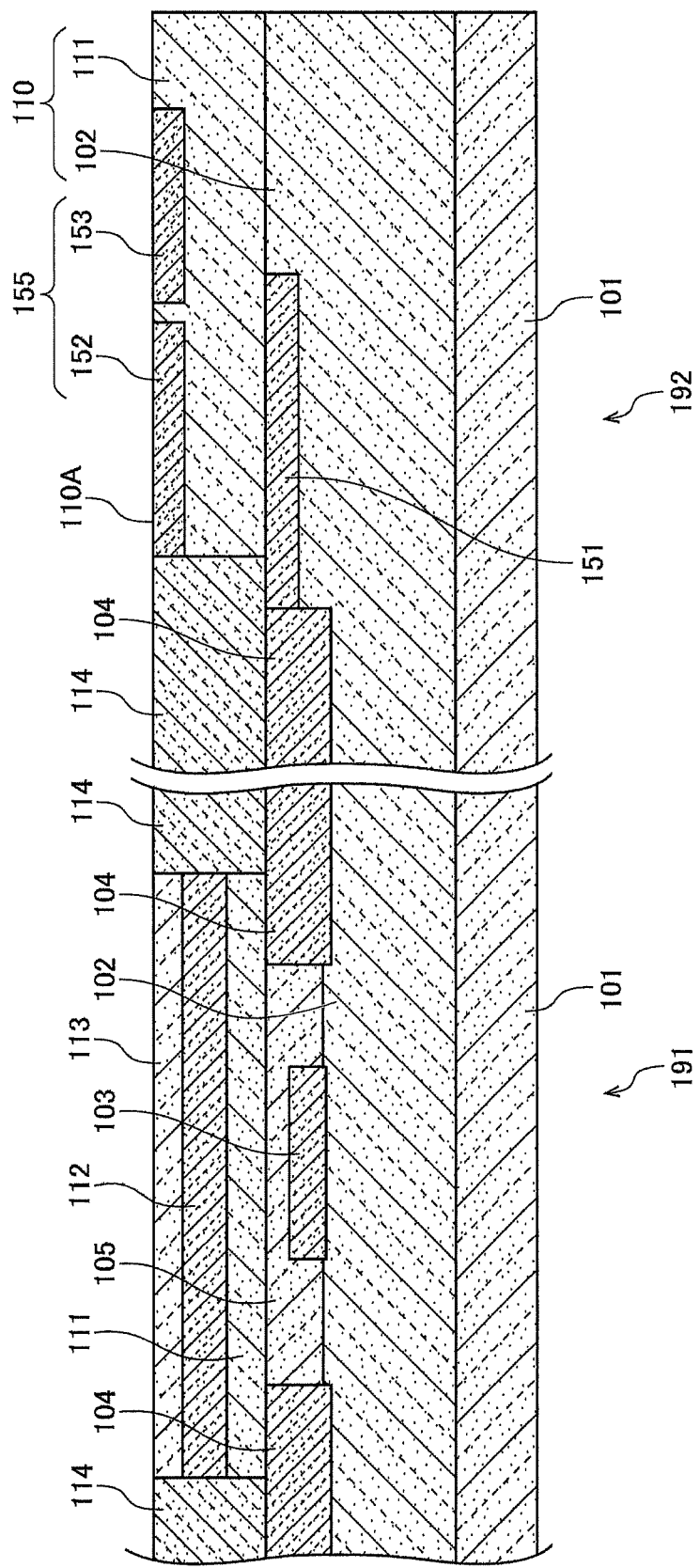
FIG. 3I is a cross sectional view (part 9) illustrating the method of manufacturing the semiconductor device according to the first embodiment.

Thereafter, as illustrated in FIG. 3I, in the terminating region 192, the second semiconductor layer 155 including the p-type JTE layer 152 and the p-type guard ring layer 153 is formed on the surface of the n⁺ drift layer 111, that is, on the first surface 110A of the first semiconductor layer 110. The JTE layer 152 is formed to make electrical contact with the p⁺ source contact layer 114. For example, the JTE layer 152 and the guard ring layer 153 may be formed via ion implantation of Al.

Figure 3J:
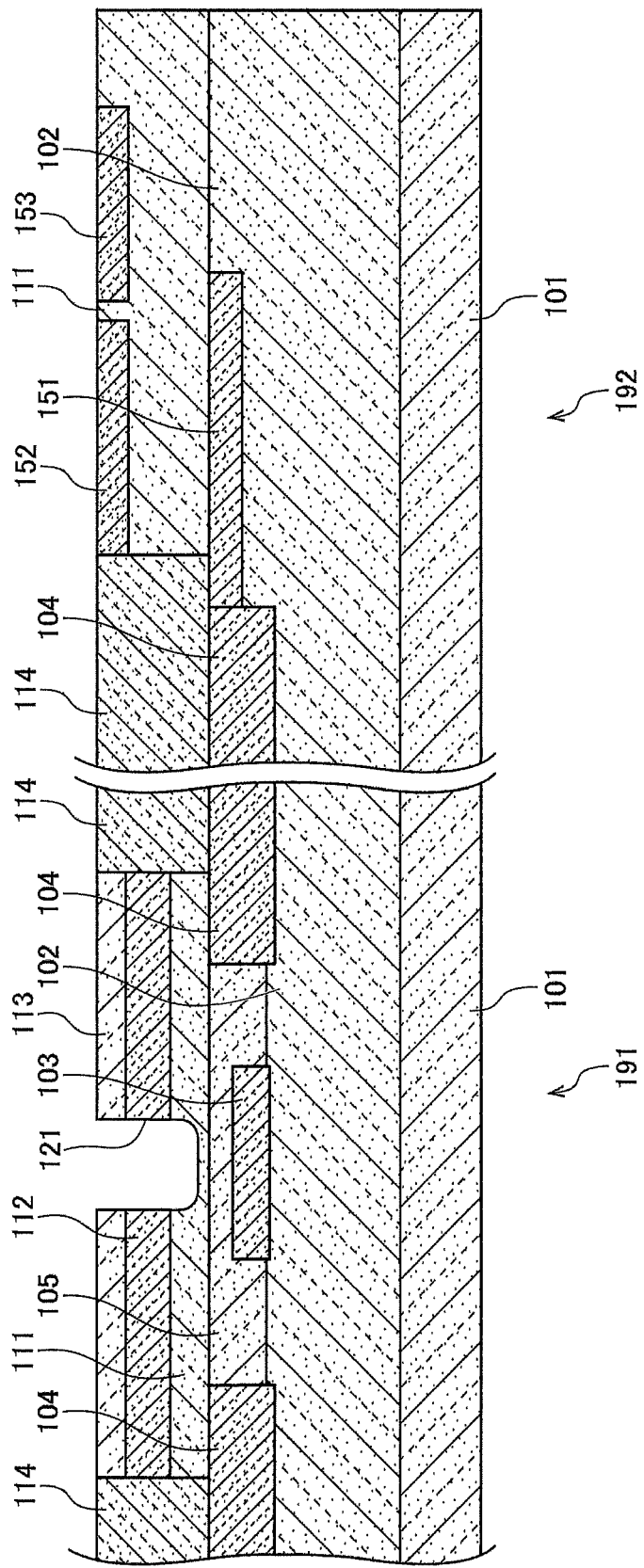
FIG. 3J is a cross sectional view (part 10) illustrating the method of manufacturing the semiconductor device according to the first embodiment.

Next, as illustrated in FIG. 3J, in the element region 191, the trench 121 for the gate is formed on the n⁺ source contact layer 113, the body layer 112, and the n⁺ drift layer 111. For example, the trench 121 may be formed via reactive ion etching (RIE).

Figure 3K:
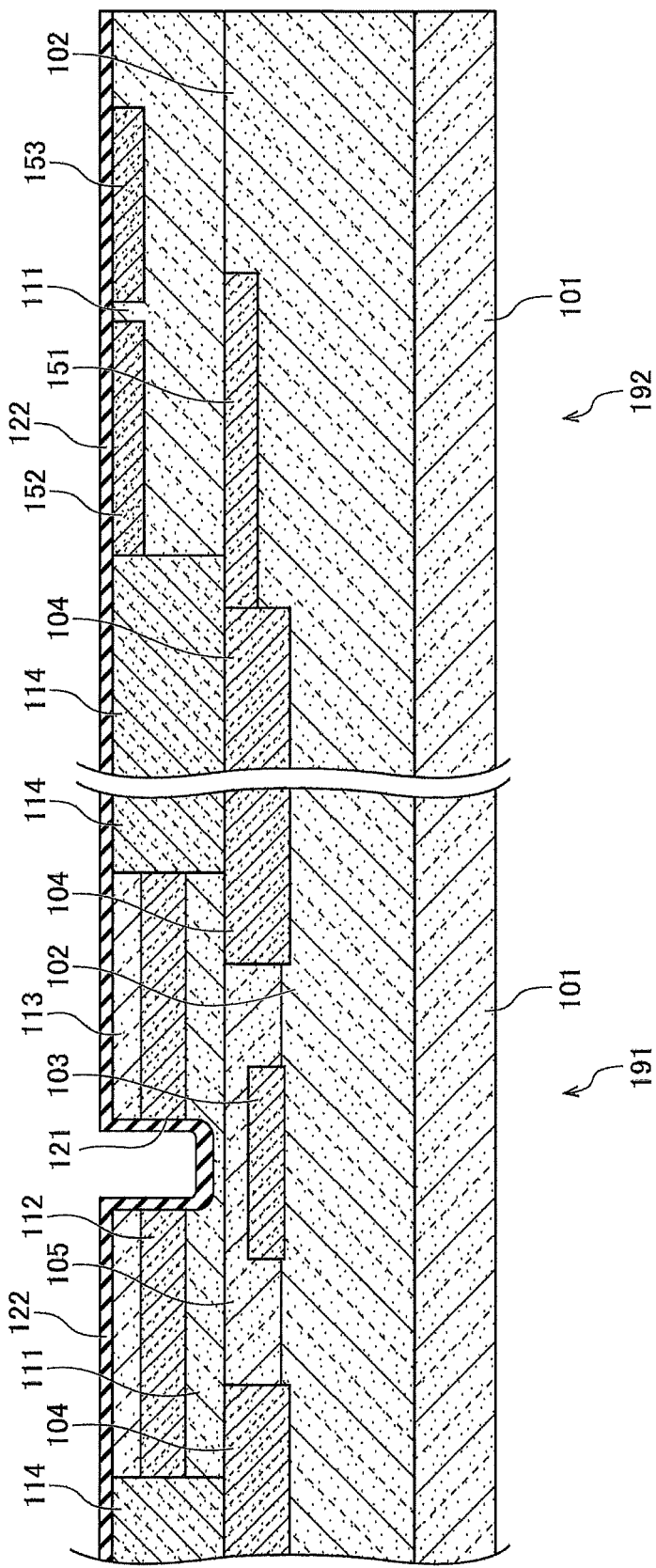
FIG. 3K is a cross sectional view (part 11) illustrating the method of manufacturing the semiconductor device according to the first embodiment.

Next, as illustrated in FIG. 3K, in the element region 191 and the terminating region 192, the gate insulating film 122 is formed on the top surface of the n⁺ drift layer 111 and on the side surface and the bottom surface of the trench 121.

Thereafter, as illustrated in FIG. 3L, in element region 191, the gate electrode 123 is formed on the gate insulating film 122 inside the trench 121.

Figure 3M:
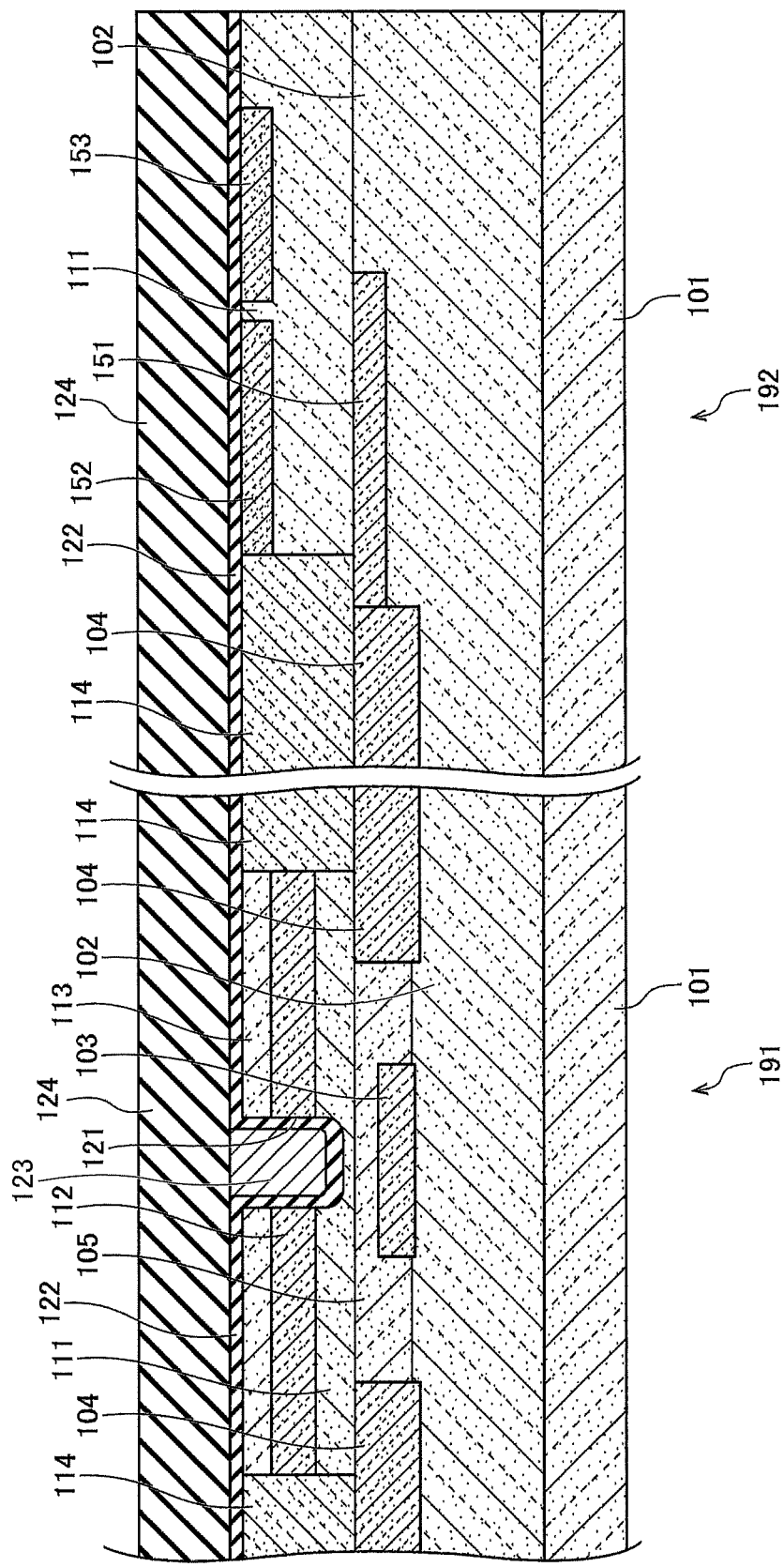
FIG. 3M is a cross sectional view (part 13) illustrating the method of manufacturing the semiconductor device according to the first embodiment.

Next, as illustrated in FIG. 3M, in the element region 191 and the terminating region 192, the interlayer insulator 124 is formed on the gate insulating film 122 and the gate electrode 123.

Figure 3N:
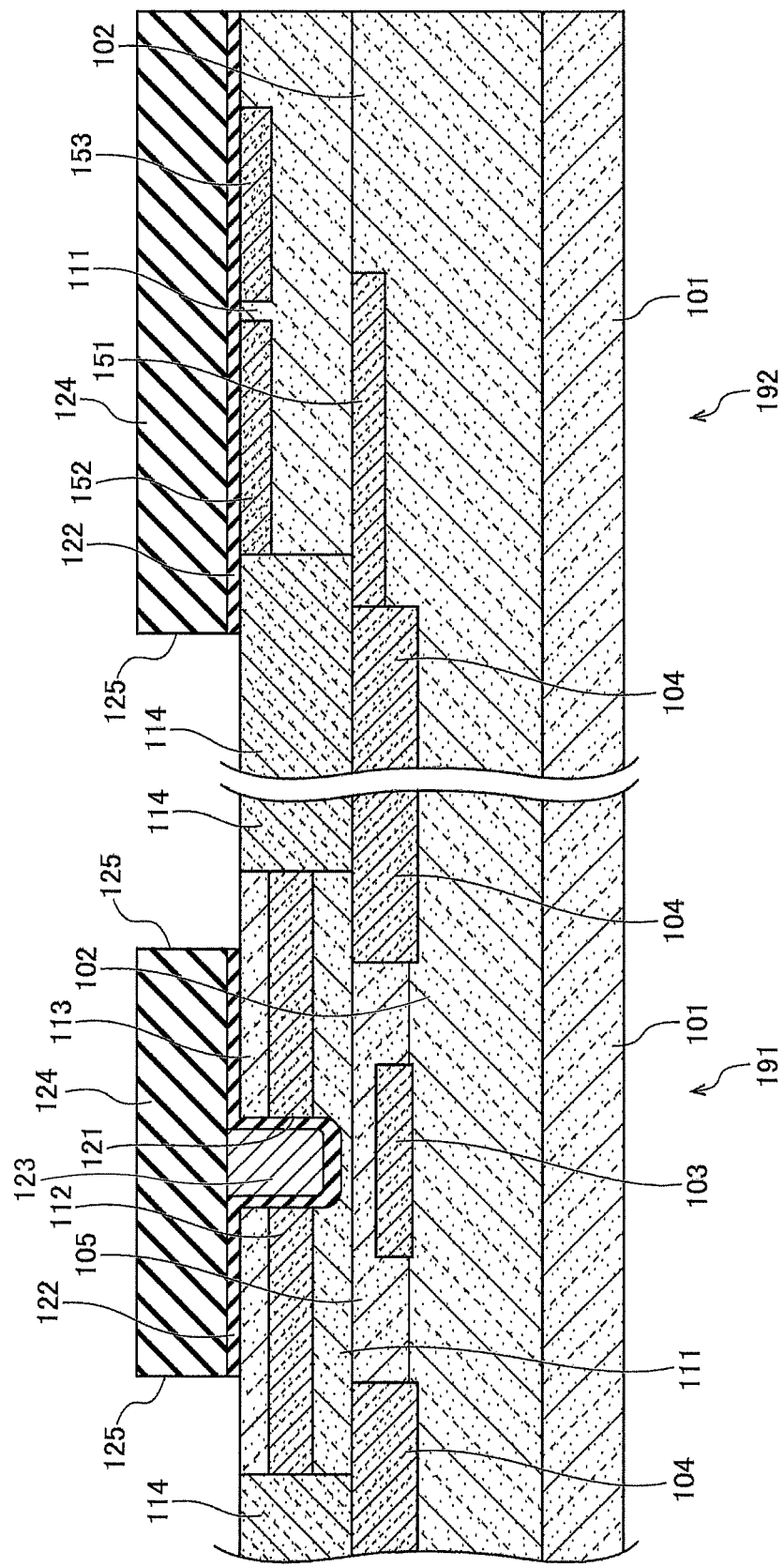
FIG. 3N is a cross sectional view (part 14) illustrating the method of manufacturing the semiconductor device according to the first embodiment.

Next, as illustrated in FIG. 3N, in the element region 191, the opening 125 is formed in the interlayer insulator 124 to expose the n⁺ source contact layer 113 and the p⁺ source contact layer 114. The opening 125 is formed to extend to the terminating region 192. Although not illustrated in FIG. 3N, an opening that exposes the gate electrode 123 is also formed in the interlayer insulator 124.

Thereafter, as illustrated in FIG. 3O, in the element region 191 and the terminating region 192, the barrier metal film 126 is formed to cover the top surface and the side surface of the interlayer insulator 124. The barrier metal film 126 is formed in the region where at least the source pad electrode 129 is to be formed.

Figure 3P:
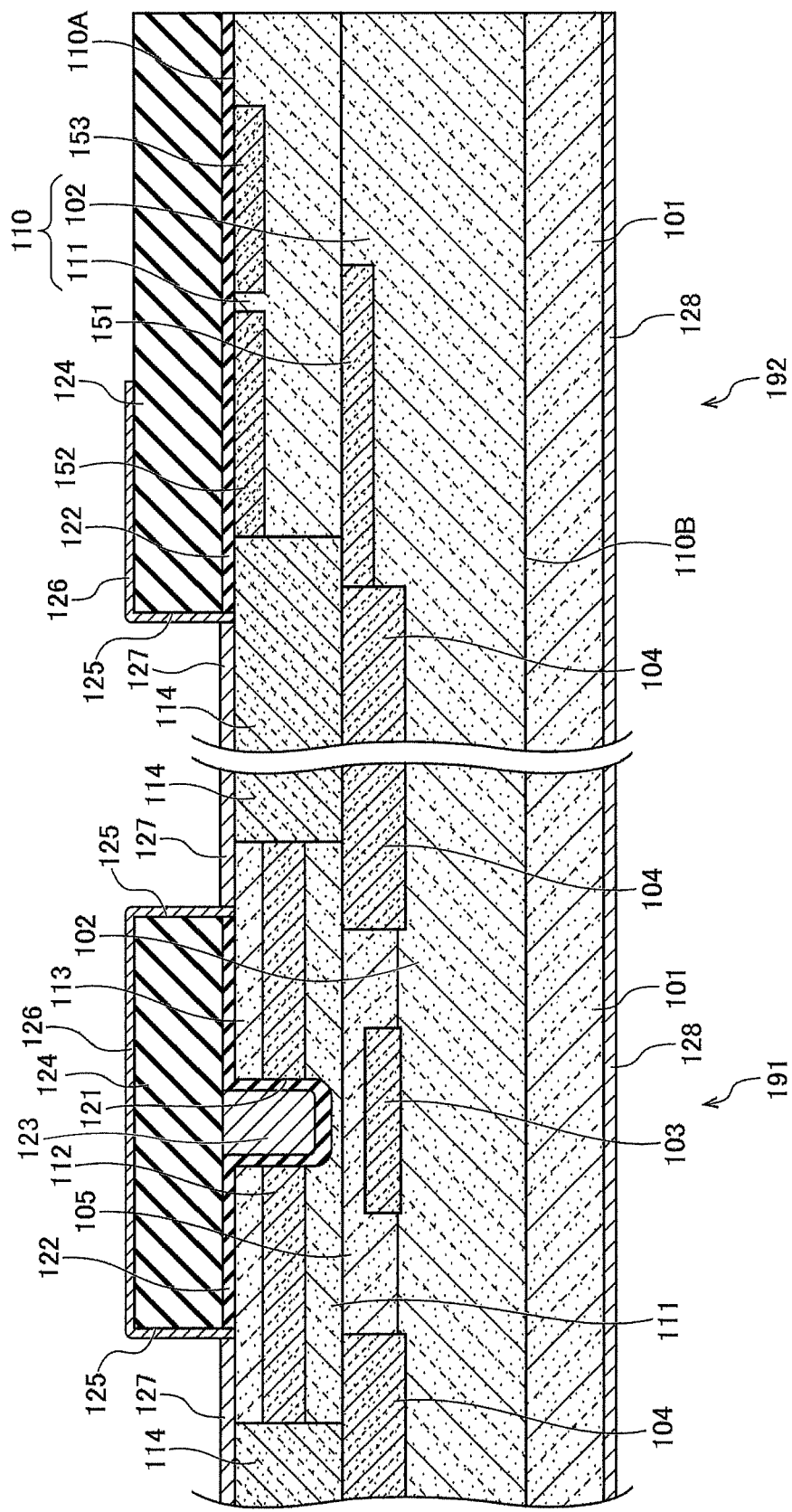
FIG. 3P is a cross sectional view (part 16) illustrating the method of manufacturing the semiconductor device according to the first embodiment.

Next, as illustrated in FIG. 3P, the ohmic electrode 127 is formed on the portions of the n⁺ source contact layer 113 and the p⁺ source contact layer 114 exposed from the opening 125. In addition, the ohmic electrode 128 for the drain is formed on the back surface of the SiC substrate 101. In other words, the ohmic electrode 128 is formed below the second surface 110B on the opposite side from the first surface 110A of the first semiconductor layer 110.

Figure 3Q:
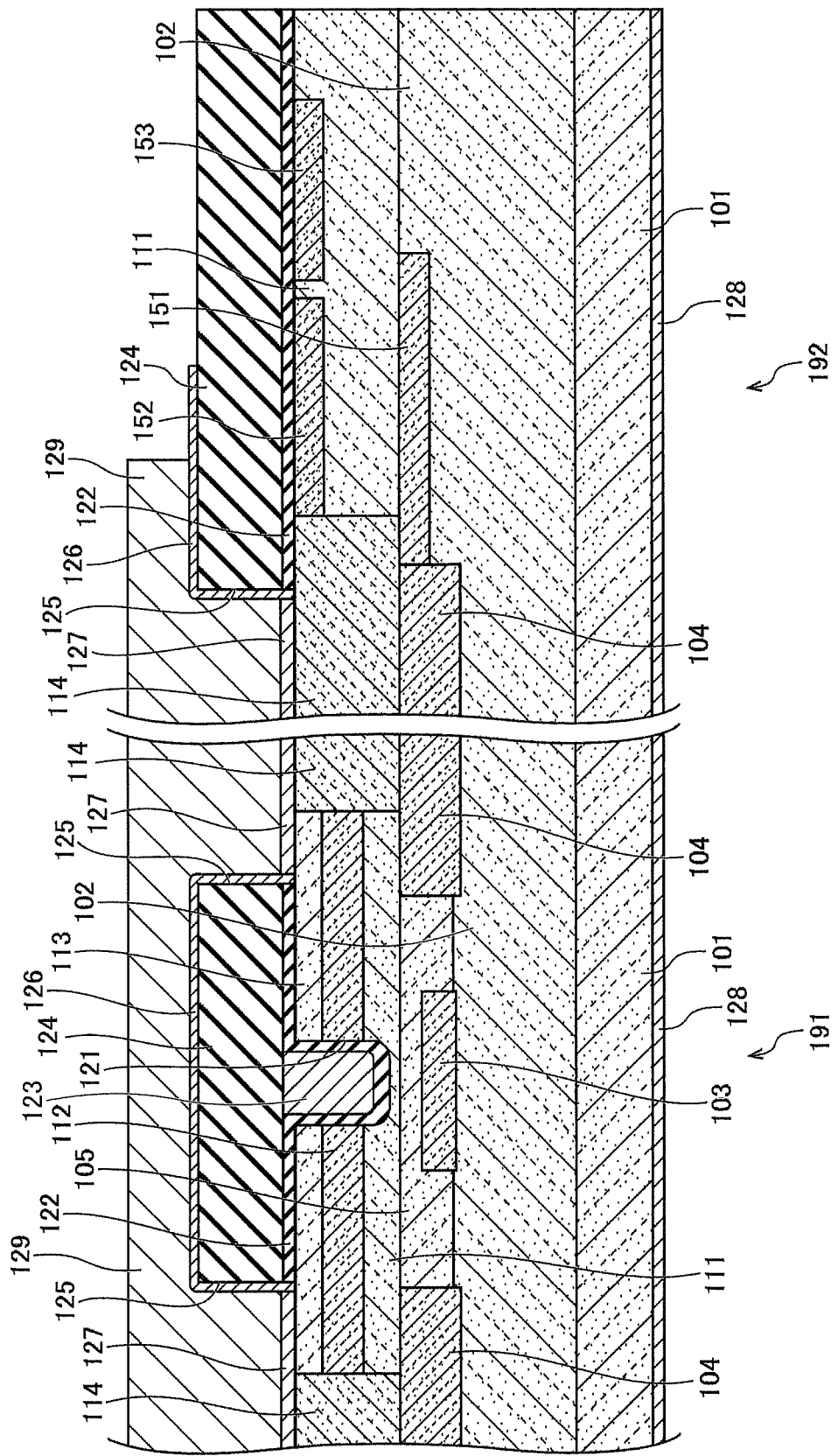
FIG. 3Q is a cross sectional view (part 17) illustrating the method of manufacturing the semiconductor device according to the first embodiment.

Next, as illustrated in FIG. 3Q, the source pad electrode 129 is formed on the barrier metal film 126 and the ohmic electrode 127.

Thereafter, as illustrated in FIG. 3R, the passivation film 130 is formed on the interlayer insulator 124 so as to cover the source pad electrode 129.

The semiconductor device 100 according to the first embodiment can be manufactured in the above described manner.

Modification of First Embodiment

Figure 4:
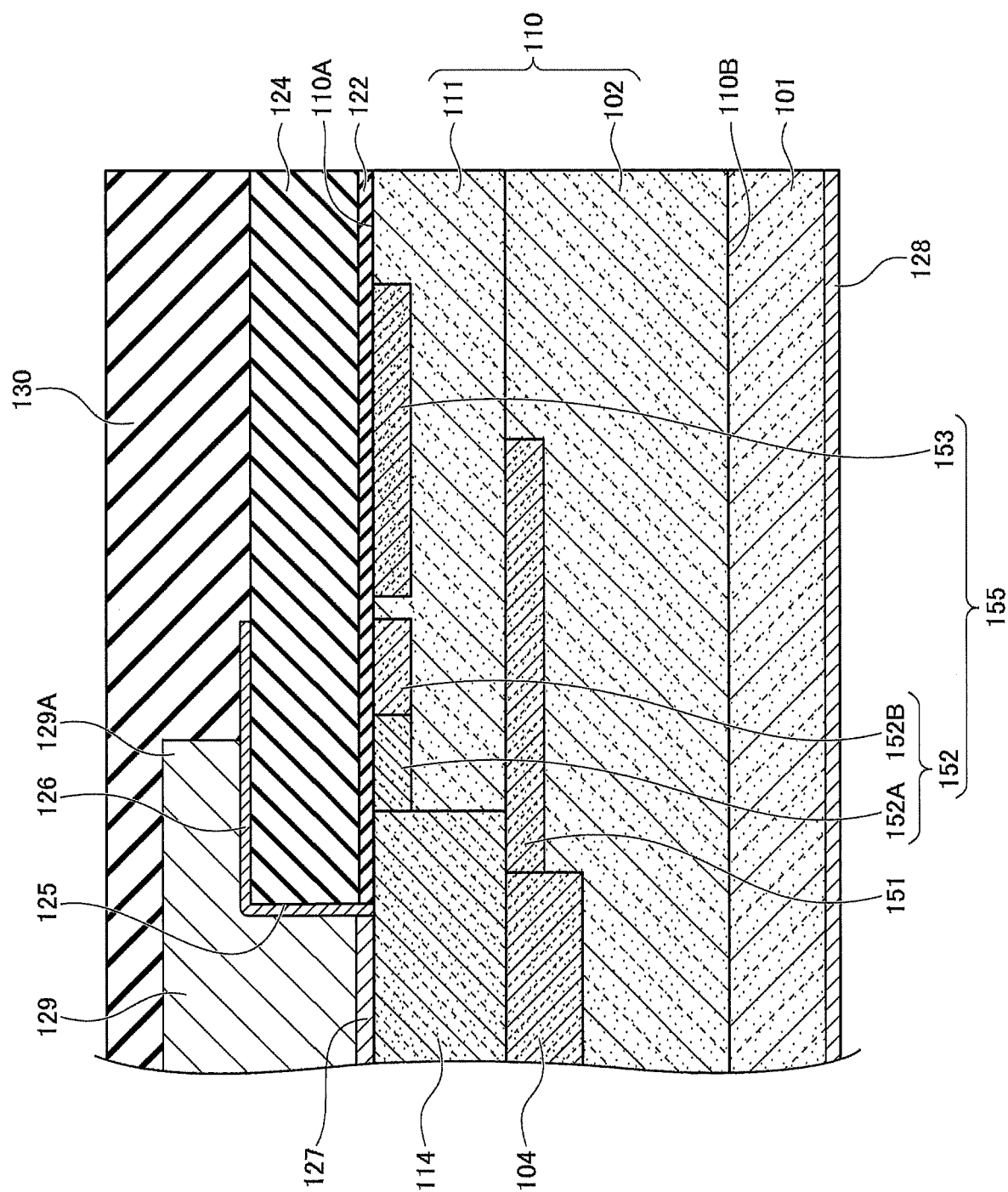
FIG. 4 is a cross sectional view illustrating the structure of the terminating region included in a modification of the first embodiment.

As illustrated in FIG. 4, the JTE layer 152 preferably has a first JTE layer 152A that is positioned below the end portion of the field plate portion 129A of the source pad electrode 129 and includes the acceptor impurity with a first effective concentration, and a second JTE layer 152B that is positioned on the side closer to the end portion of the second semiconductor layer 155 than the first JTE layer 152A and includes the acceptor impurity with a second effective concentration lower than the first effective concentration. The depletion of the first JTE layer 152A can be reduced during the reverse bias application, to reduce the electric field concentration to the interlayer insulator 124 making contact with the end portion of the field plate portion 129A. For example, the first JTE layer 152A includes Al as the acceptor impurity, with an effective acceptor concentration of $2 \times 10^{17}$ cm⁻³ to $1 \times 10^{19}$ cm⁻³, and the second JTE layer 152B includes Al as the acceptor impurity with an effective acceptor concentration of $1 \times 10^{17}$ cm⁻³ to $5 \times 10^{18}$ cm⁻³. In this modification, the effective acceptor concentration of the embedded JTE layer 151 is higher than the effective acceptor concentrations of the second JTE layer 152B and the guard ring layer 153, and the effective acceptor concentration of the first JTE layer 152A is higher than the effective acceptor concentration of the embedded JTE layer 151. The first JTE layer 152A is an example of a first region, and the second JTE layer 152B is an example of a second region.

Second Embodiment

Figure 5:
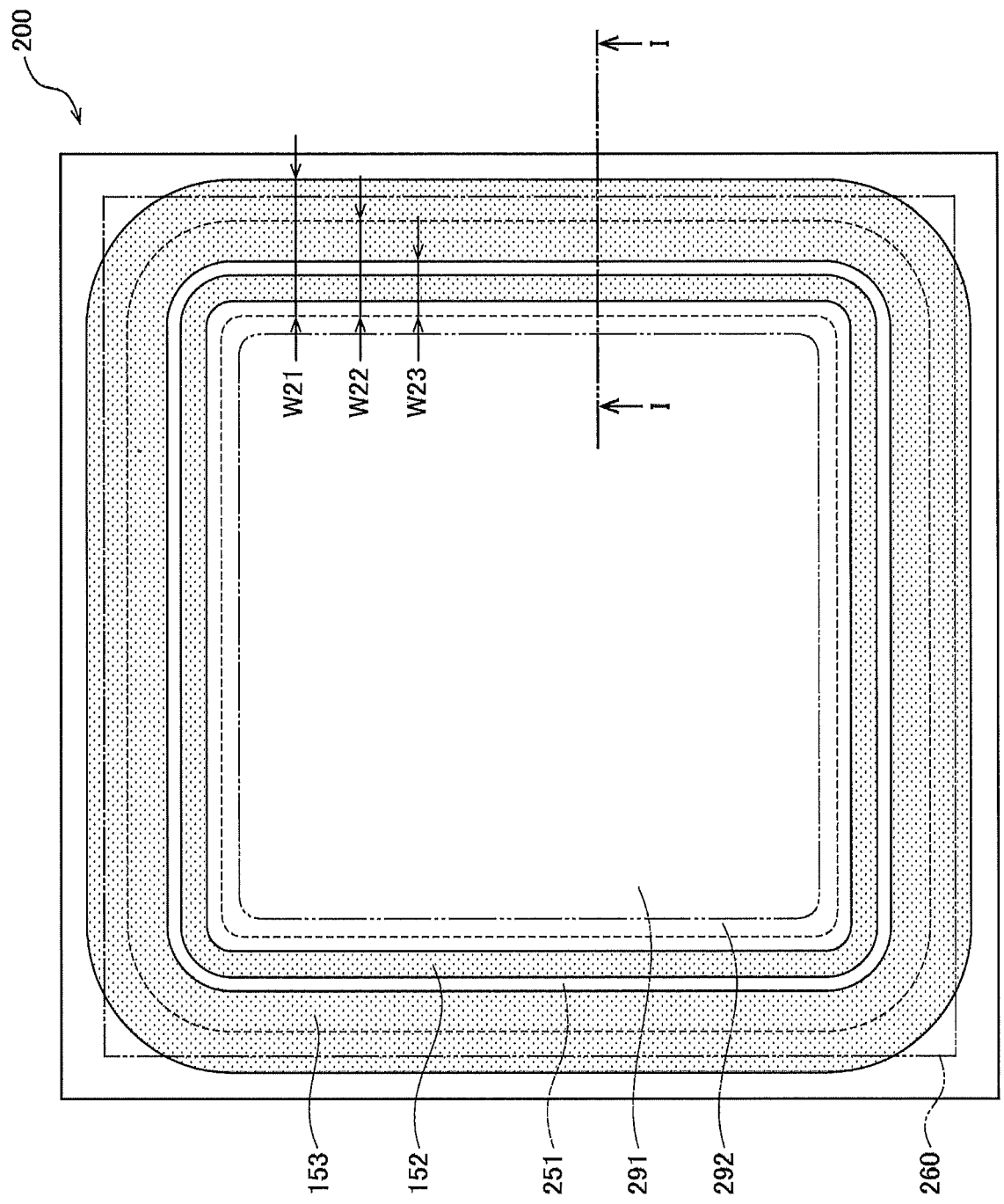
FIG. 5 is a diagram illustrating the layout of the layers included in the semiconductor device according to a second embodiment.
Figure 6A:
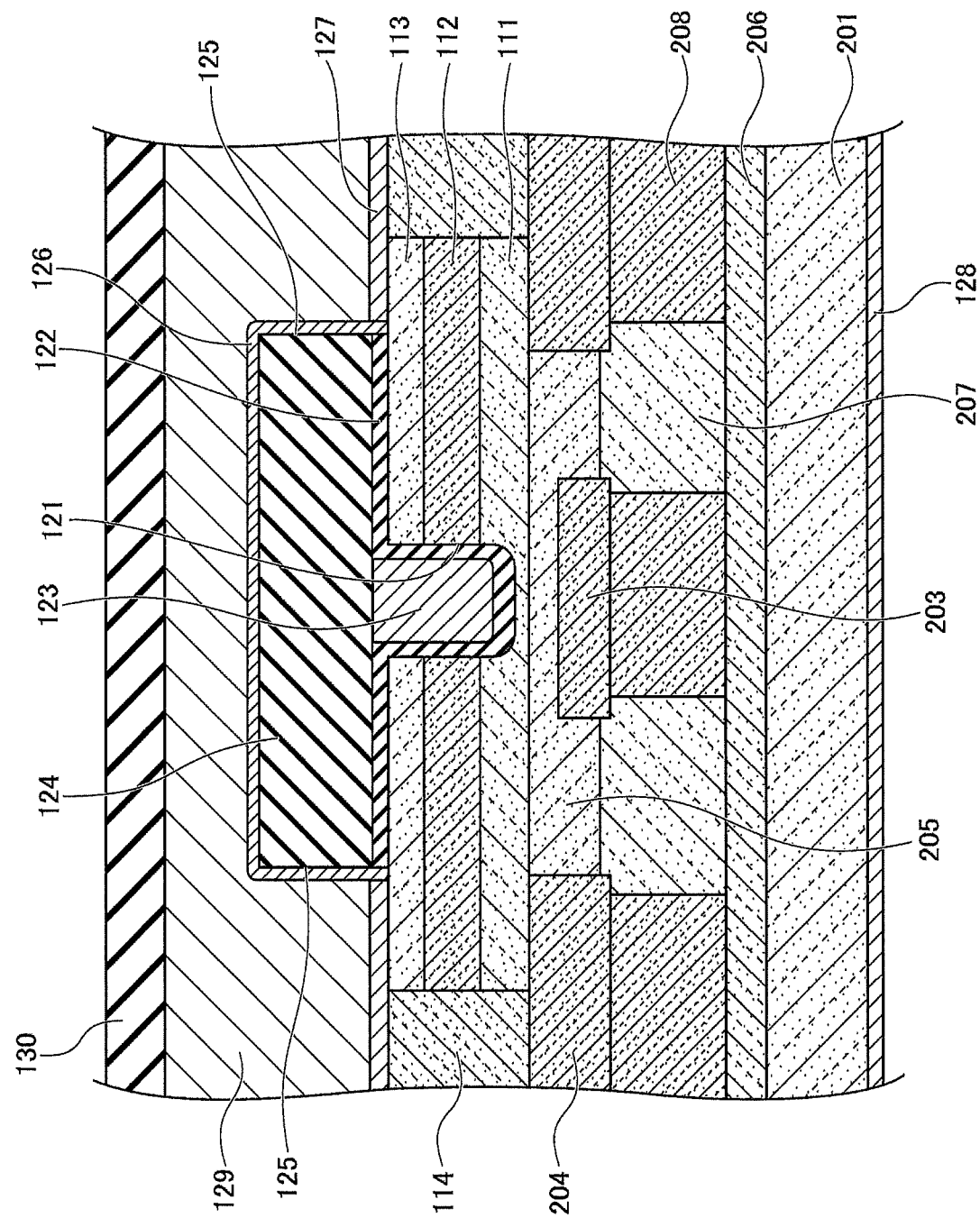
FIG. 6A is a cross sectional view illustrating the structure of the element region included in the semiconductor device according to the second embodiment.
Figure 6B:
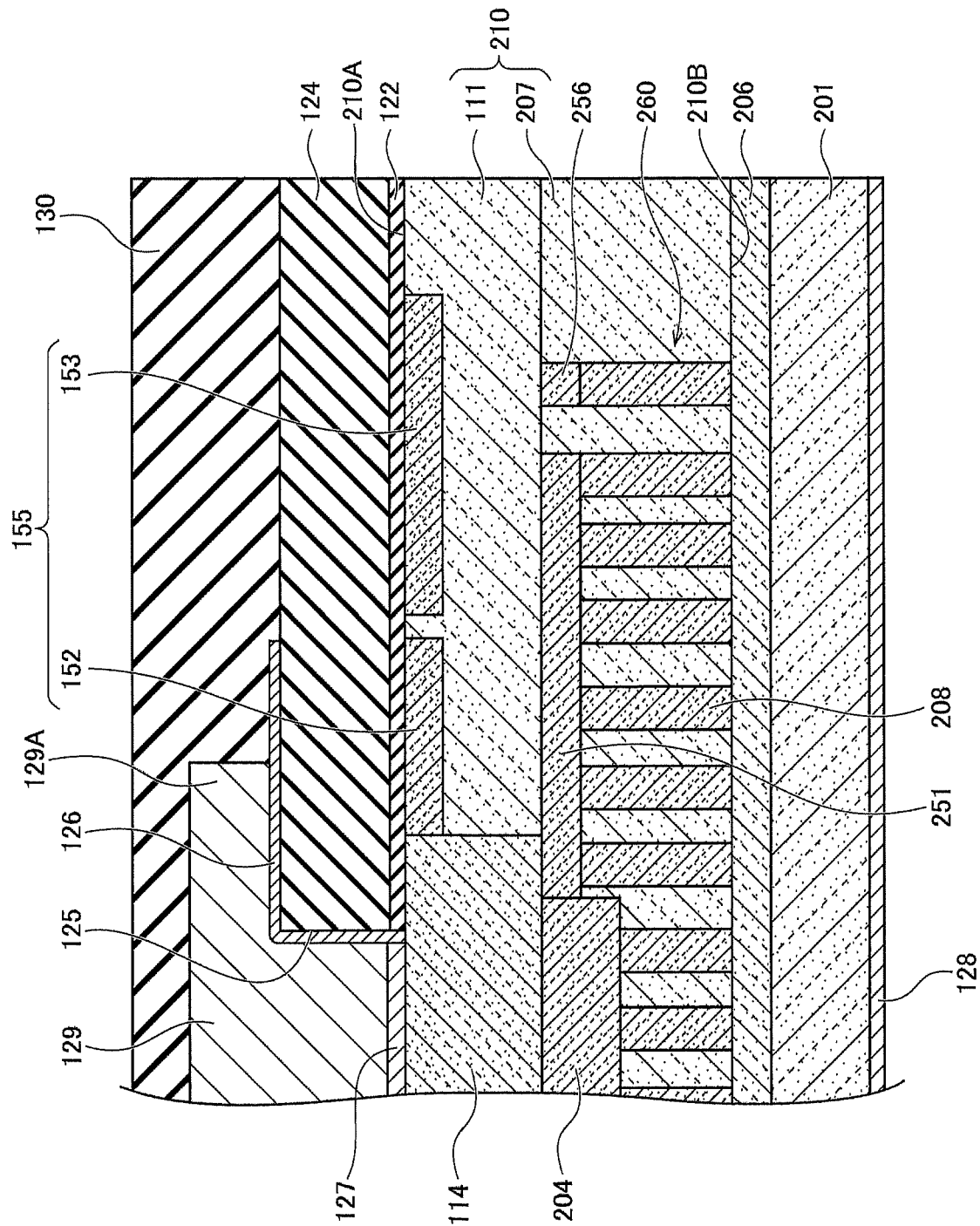
FIG. 6B is a cross sectional view illustrating the structure of the terminating region included in the semiconductor device according to the second embodiment.

First, a second embodiment will be described. The second embodiment relates to a semiconductor device having a plurality of trench SiC-MOSFETs, and a withstand voltage of approximately 1.2 kV. FIG. 5 is a diagram illustrating the layout of the layers included in the semiconductor device according to the second embodiment. FIG. 6A is a cross sectional view illustrating the structure of the element region included in the semiconductor device according to the second embodiment. FIG. 6B is a cross sectional view illustrating the structure of the terminating region included in the semiconductor device according to the second embodiment. FIG. 6B corresponds to a cross sectional view along a line I-I in FIG. 5. The scale in each of these figures is appropriately adjusted to facilitate recognition of each portion, and in particular, the scale along the horizontal reduction between the element region and the terminating region is not uniform. In addition, the end portion of the layer or the like, unless otherwise indicated, refers to the end portion of the layer or the like on the side separated from the element region of the layer or the like.

A semiconductor device 200 according to the second embodiment is the so-called vertical semiconductor device, including the source pad electrode 129 provided above a SiC substrate 201, and the ohmic electrode 128 for the drain, provided below the SiC substrate 201. The semiconductor device 200 includes an element region 291 having a plurality of semiconductor elements through which a current flows due to a voltage applied between the ohmic electrode 128 and the source pad electrode 129, and a terminating region 292 provided around the element region 291.

As illustrated in FIG. 5, FIG. 6A, and FIG. 6B, an n⁻ buffer layer 206 is formed on the SiC substrate 201, and an n⁺ drift layer 207 is formed on the n⁻ buffer layer 206. The n⁺ drift layer 207 is periodically formed with p pillars 208, and a super junction (SJ) structure 260 is formed of the p pillars 208, and the n⁺ drift layer 207 between the p pillars 208. The n⁻ buffer layer 206 is a SiC layer having a thickness of 1 μm to 5 μm, and including N as the donor impurity, with an effective donor concentration of $1 \times 10^{16}$ cm$^{-3}$ to $1 \times 10^{17}$ cm$^{-3}$, for example. The n⁺ drift layer 207 is a SiC layer having a thickness of 3 μm to 7 μm, and including N as the donor impurity, with an effective donor concentration of $5 \times 10^{16}$ cm$^{-3}$ to $5 \times 10^{17}$ cm$^{-3}$. The p pillars 208 include Al as the acceptor impurity, with an effective acceptor concentration of $5 \times 10^{16}$ cm$^{-3}$ to $5 \times 10^{17}$ cm$^{-3}$. The p pillars 208 are an example of columnar semiconductor layers.

As illustrated in FIG. 6A, in the element region 291, an n-type current spreading layer 205 is formed on a surface of n⁺ drift layer 207 for each semiconductor device, and a p-type shield region 203 is provided on the inside of the n-type current spreading layer 205, and a p-type shield region 204 is provided on the outside of the n-type current spreading layer 205. The shield regions 203 and 204 are electrically connected to the p pillars 208, respectively, and the current spreading layer 205 is electrically connected to the n⁺ drift layer 207. The current spreading layer 205 includes P as the donor impurity with an effective donor concentration of $1 \times 10^{16}$ cm$^{-3}$ to $1 \times 10^{18}$ cm$^{-3}$. The shield regions 203 and 204 include Al as the acceptor impurity, with an effective acceptor concentration of $1 \times 10^{17}$ cm$^{-3}$ to $5 \times 10^{18}$ cm$^{-3}$.

As illustrated in FIG. 6B, the shield region 204 is formed to extend to the terminating region 292. In the terminating region 292, a p-type embedded JTE layer 251 is formed on the surface of the n⁺ drift layer 207 to electrically connect to the shield region 204. The embedded JTE layer 251 is electrically connected to a portion of the p pillars 208, the portion of the p pillars 208 is in a floating state electrically independent of the embedded JTE layer 251, and a p-type semiconductor layer 256 is formed on the p pillar 208. The embedded JTE layer 251 and the p-type semiconductor layer 256 include Al as the acceptor impurity, with an effective acceptor concentrations of $1 \times 10^{17}$ cm$^{-3}$ to $5 \times 10^{18}$ cm$^{-3}$. The embedded JTE layer 251 is an example of the third semiconductor layer.

As illustrated in FIG. 6A and FIG. 6B, in the element region 291 and the terminating region 292, the n⁺ drift layer 111 is formed on the n⁺ drift layer 207. The n⁺ drift layer 207 and the n⁺ drift layer 111 are included in a n-type first semiconductor layer 210.

As illustrated in FIG. 6A, in the element region 291, the p-type body layer 112 is formed on the surface of the n⁺ drift layer 111, that is, on a first surface 210A of the first semiconductor layer 210, and the n⁺ source contact layer 113 is formed on the surface of the body layer 112. In addition, for each semiconductor device, the p⁺ source contact layer 114 is formed on the n⁺ drift layer 111, the body layer 112, and the n⁺ source contact layer 113, on the shield region 204.

As illustrated in FIG. 6B, the p⁺ source contact layer 114 is formed to extend to the terminating region 292. In the terminating region 292, the p-type JTE layer 152 is formed on the surface of the n⁺ drift layer 111 to electrically connect to the p⁺ source contact layer 114, and further, the p-type guard ring layer 153 is formed around the JTE layer 152. The JTE layer 152 and the guard ring layer 153 are included in the p-type second semiconductor layer 155. The p⁺ source contact layer 114 is an example of the fourth semiconductor layer.

As illustrated in FIG. 6A, in the element region 291, the trench 121 for the gate is formed in the n⁺ source contact layer 113, the body layer 112, and the n⁺ drift layer 111. In addition, the gate insulating film 122 is formed on the top surface of the n⁺ drift layer 111, and on the side surface and the bottom surface of the trench 121, and the gate electrode 123 is formed on the gate insulating film 122 within the trench 121.

As illustrated in FIG. 6A and FIG. 6B, in the element region 291 and the terminating region 292, the interlayer insulator 124 is formed on the gate insulating film 122 and the gate electrode 123, and the opening 125, that exposes the n⁺ source contact layer 113 and the p⁺ source contact layer 114, is formed in the interlayer insulator 124. The opening 125 is formed to extend to the terminating region 192. An opening, that exposes the gate electrode 123 but is not illustrated, is also formed in the interlayer insulator 124.

The barrier metal film 126 is formed to cover the top surface and the side surface of the interlayer insulator 124. The ohmic electrode 127 is formed on the portions of the n⁺ source contact layer 113 and the p⁺ source contact layer 114 exposed from the opening 125, and the ohmic electrode 128 for the drain is formed on the back surface of the SiC substrate 201. In other words, the ohmic electrode 128 is formed below a second surface 210B on the opposite side from the first surface 210A of the first semiconductor layer 210. The source pad electrode 129 is formed on the barrier metal film 126 and the ohmic electrode 127, and the passivation film 130 is formed on the interlayer insulator 124 so as to cover the source pad electrode 129.

The semiconductor device 200 according to the second embodiment, having the above described structure, can obtain effects similar to those of the semiconductor device 100 according to the first embodiment. Further, because the SJ structure 260 is provided, the semiconductor device 200 can further reduce the resistance of the current path.

In the semiconductor device 200, the p pillars 208 are electrically connected to the embedded JTE layer 251, and the electric field more easily concentrates at the end portion of the embedded JTE layer 151 by an amount corresponding to a height of the p pillars 208. However, in this embodiment, the concentration of the electric field at the end portion of the embedded JTE layer 251 can be reduced, because the p pillars 208, electrically independent of the embedded JTE layer 251, are provided outside the end portion of the embedded JTE layer 251.

For example, a distance W21 from an interface of the embedded JTE layer 251 with the shield region 204 to the end portion of the guard ring layer 153 is approximately four times to approximately five times the thickness of the first semiconductor layer 210. When the distance W21 is too long, the effect of the improving the withstand voltage may saturate, while on the other hand, a ratio of the element region 291 with respect to the entire semiconductor device 200 may become too small, thereby increasing the resistance of the current path. When the distance W21 is too short, an excellent withstand voltage may not be obtained. In addition, for example, a distance W12 from the interface of the embedded JTE layer 251 with the shield region 104 to the end portion of the embedded JTE layer 251 is approximately ⅔ of the distance W21, and a distance W23 from the interface of the embedded JTE layer 251 with the shield region 104 to the edge of the element region 291 of the guard ring layer 153 is approximately ⅓ of the distance W21.

(Method of Manufacturing Semiconductor Device)

Next, a method of manufacturing the semiconductor device 200 will be described. FIG. 7A through FIG. 7F are cross sectional views illustrating the method of manufacturing the semiconductor device 200 according to the second embodiment.

Figure 7A:
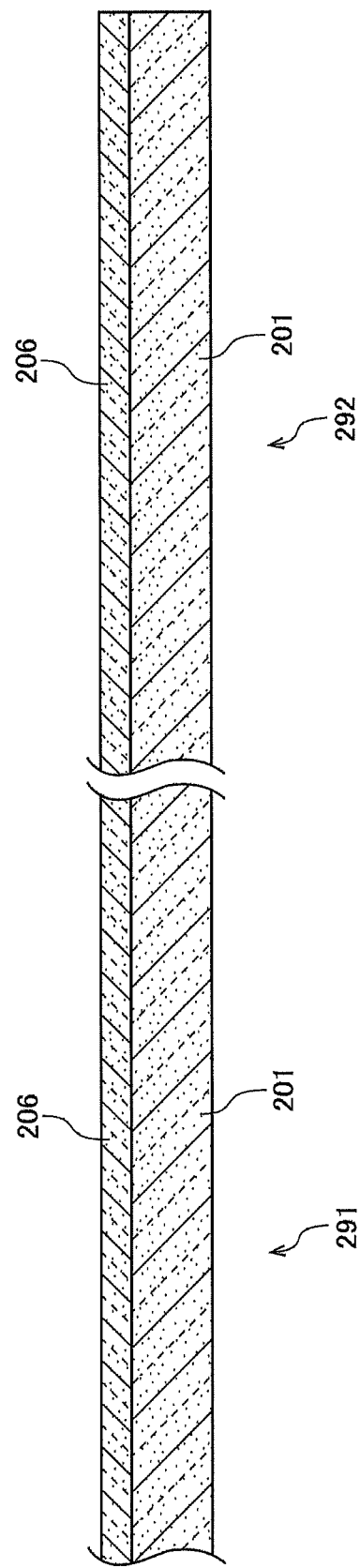
FIG. 7A is a cross sectional view (part 1) illustrating the method of manufacturing the semiconductor device according to the second embodiment.

First, as illustrated in FIG. 7A, the n$^-$ buffer layer 206 is formed on the SiC substrate 201. For example, the n$^-$ buffer layer 206 may be formed via epitaxial growth with added N.

Figure 7B:
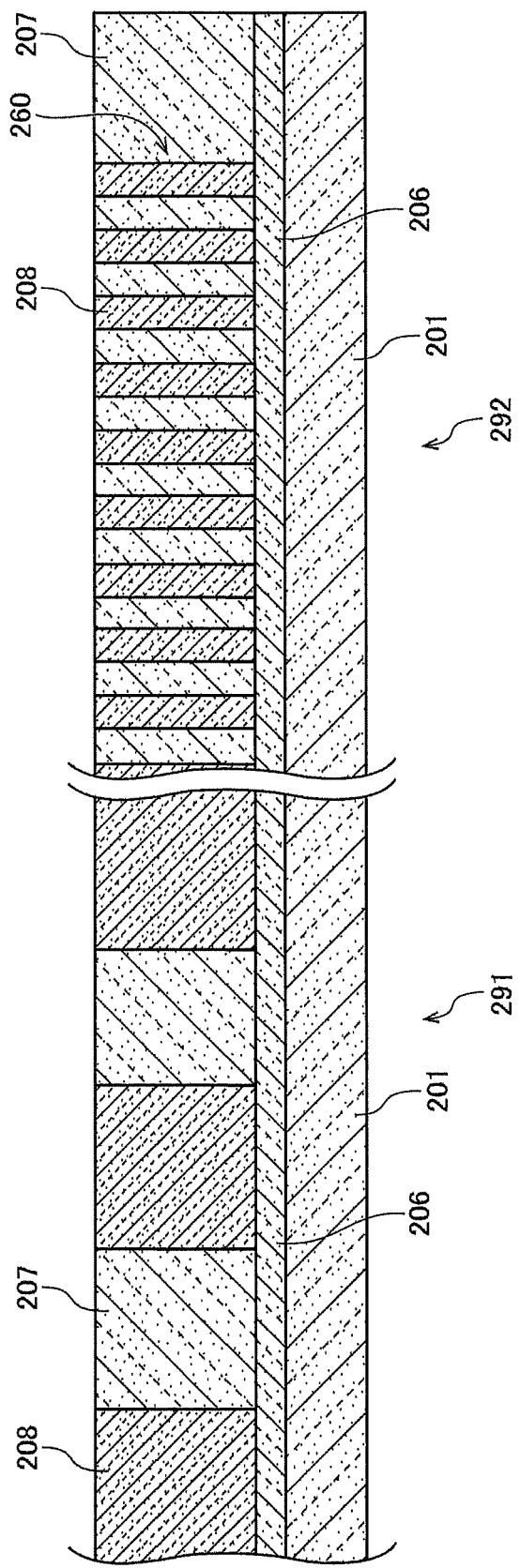
FIG. 7B is a cross sectional view (part 2) illustrating the method of manufacturing the semiconductor device according to the second embodiment.

Next, as illustrated in FIG. 7B, the n$^+$ drift layer 207, including the p pillars 208 and the SJ structure 260, is formed on the n$^-$ buffer layer 206. Such an n$^+$ drift layer 207 may be formed by a repeating a process including forming an n-type semiconductor layer by an epitaxial growth with added N, and an ion implantation of Al into this n-type semiconductor layer.

Figure 7C:
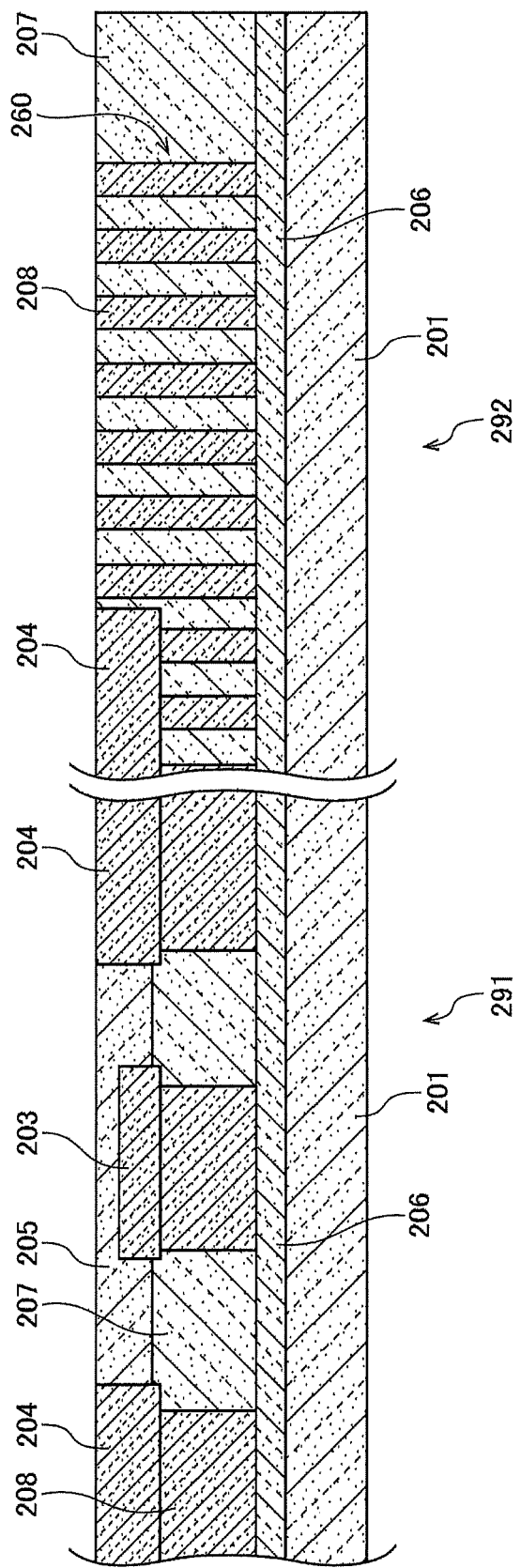
FIG. 7C is a cross sectional view (part 3) illustrating the method of manufacturing the semiconductor device according to the second embodiment.

Thereafter, as illustrated in FIG. 7C and similar to the first embodiment, in the element region 291, the p-type shield regions 203 and 204 and the n-type current spreading layer 205 are formed on the surface of the n$^+$ drift layer 207.

Figure 7D:
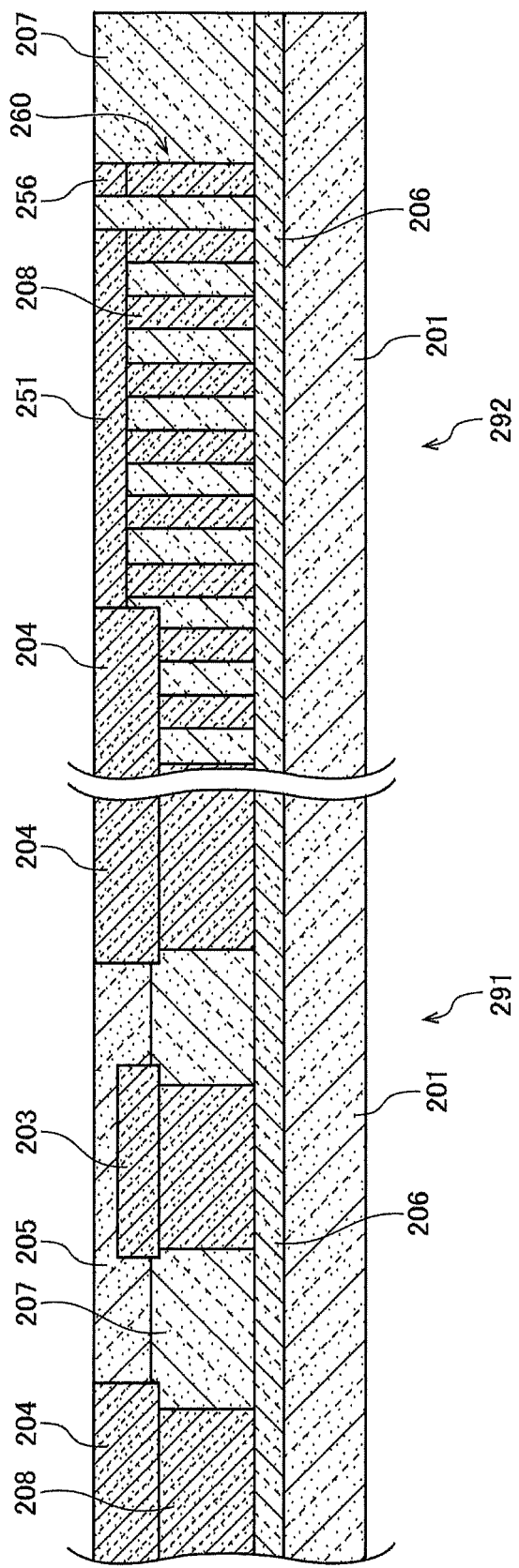
FIG. 7D is a cross sectional view (part 4) illustrating the method of manufacturing the semiconductor device according to the second embodiment.

Next, as illustrated in FIG. 7D, in the terminating region 292, the p-type embedded JTE layer 251 and the p-type semiconductor layer 256 are formed on the surface of the n$^+$ drift layer 207. For example, the embedded JTE layer 251 and the p-type semiconductor layer 256 may be formed via ion implantation of Al. The embedded JTE layer 251 is formed to electrically contact the shield region 204, and to electrically contact a portion of the p pillars 208, and the p-type semiconductor layer 256 is formed to electrically contact the p pillar 208 positioned outside the end portion of the embedded JTE layer 251.

Figure 7E:
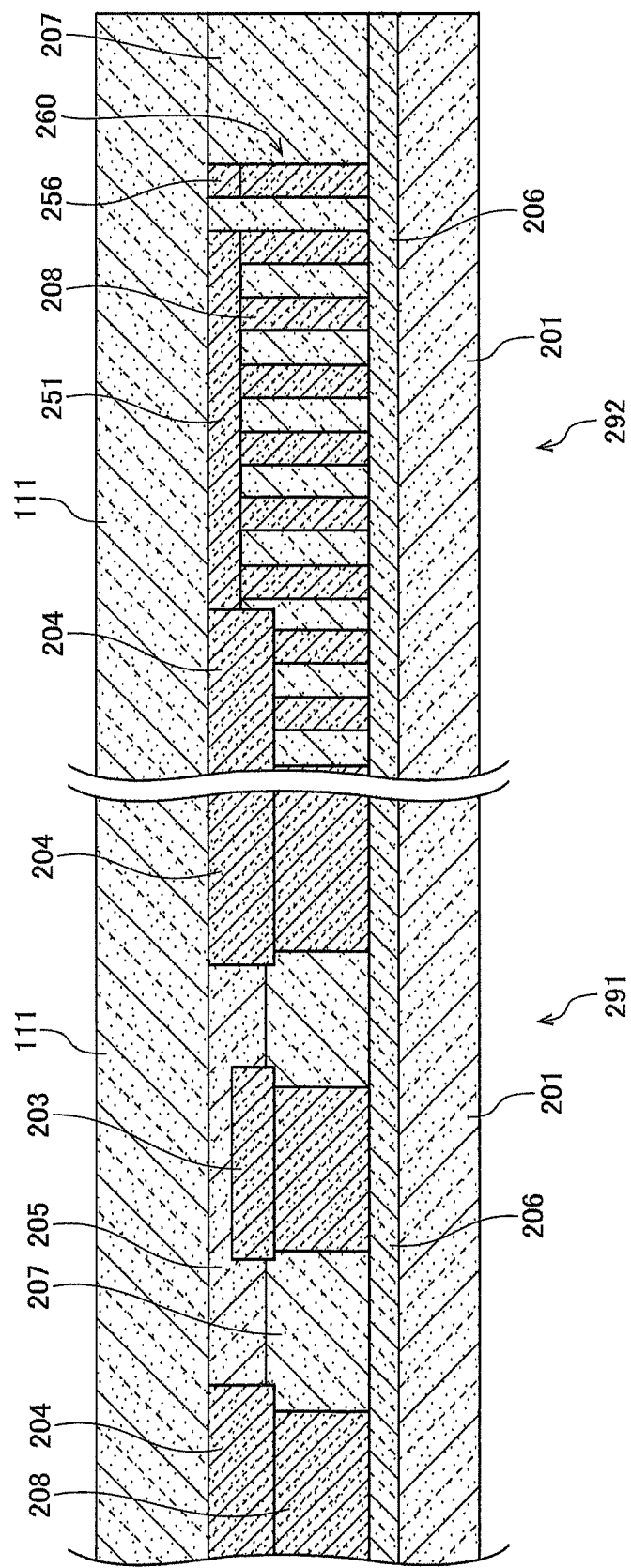
FIG. 7E is a cross sectional view (part 5) illustrating the method of manufacturing the semiconductor device according to the second embodiment.

Next, as illustrated in FIG. 7E and similar to the first embodiment, in the element region 291 and the terminating region 292, the n$^+$ drift layer 111 is formed on the n$^+$ drift layer 207.

Thereafter, as illustrated in FIG. 7F and similar to the first embodiment, the processes from the formation of the p-type body layer 112 to the formation of the passivation film 130 are performed.

The semiconductor device 200 according to the second embodiment can be manufactured in the above described manner.

Modification of Second Embodiment

Figure 8:
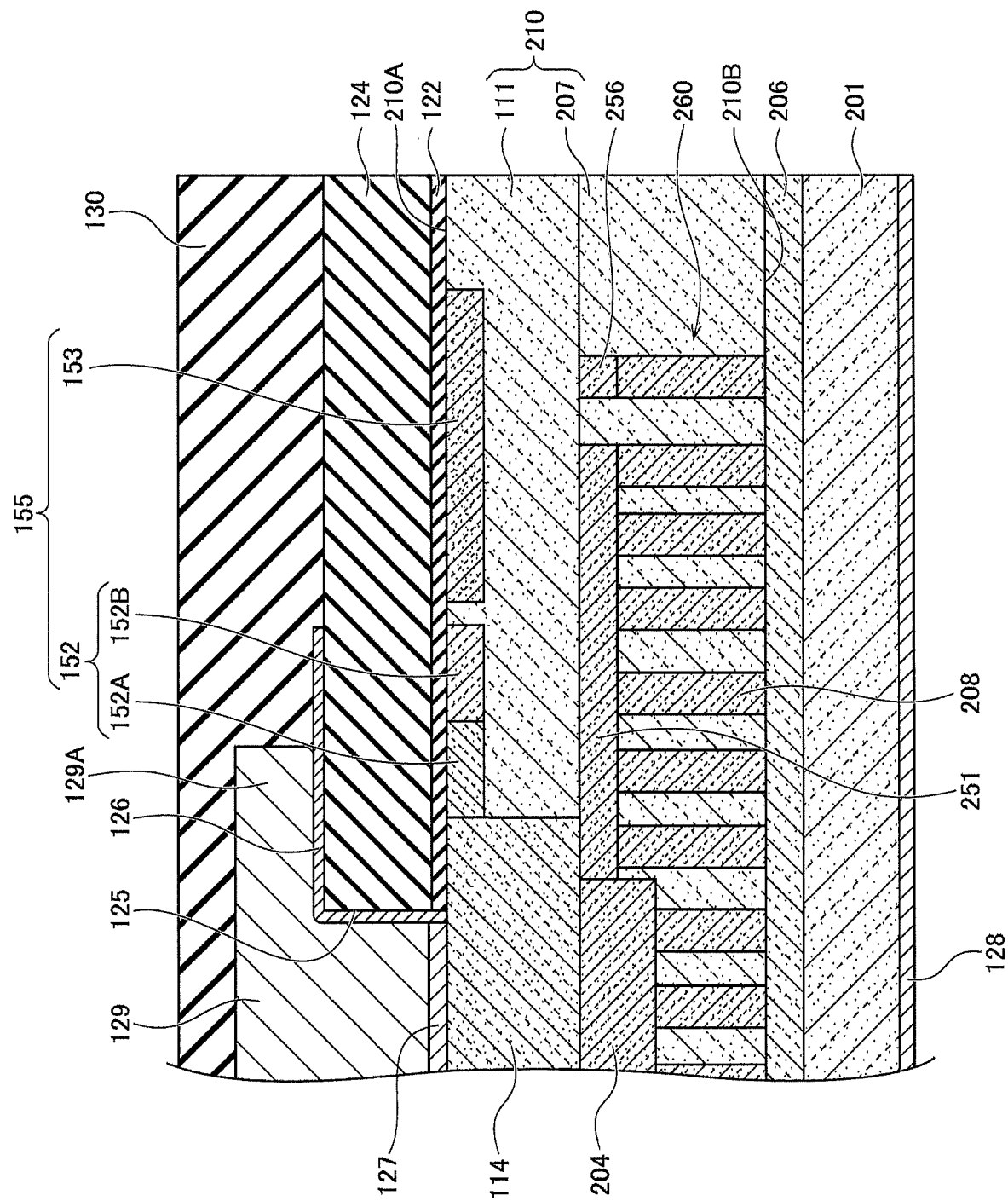
FIG. 8 is a cross sectional view illustrating the structure of the terminating region included in a modification of the second embodiment.

As illustrated in FIG. 8 and similar to the first embodiment, the JTE layer 152 preferably has the first JTE layer 152A and the second JTE layer 152B. The depletion of the first JTE layer 152A can be reduced during the reverse bias application, to reduce the electric field concentration to the interlayer insulator 124 making contact with the end portion of the field plate portion 129A.

In the first embodiment and the second embodiment, the thickness, the effective impurity concentration, or the like of the semiconductor layers are set to suit the withstand voltage of approximately 1.2 kV, however, the withstand voltage of the semiconductor device, and the thickness, the impurity concentration, or the like of the semiconductor layers are not limited those described above. For example, the thickness, the effective impurity concentration, or the like of the semiconductor layers may be set to suit a withstand voltage of approximately 3.3 kV or a withstand voltage of approximately 600 V. For example, the withstand voltage can be increased by increasing the thickness of the semiconductor layers or by decreasing the effective impurity concentration of the semiconductor layers. On the other hand, the increase in the thickness of the semiconductor layers and the decrease in the effective impurity concentration of the semiconductor layers cause the resistance of the current path to become high. Accordingly, the thickness and the effective impurity concentration of the semiconductor layers are preferably adjusted by taking into consideration a balance between the withstand voltage and the resistance value of the current path. Further, in the first embodiment and the second embodiment, SiC is used for the semiconductor layers, but similar effects can be obtained using Si.

Although the embodiments are described in detail above, it is to be understood that various variations and modifications may be made within the scope of the appended claims, and are not limited to specific embodiments.

DESCRIPTION OF THE REFERENCE NUMERALS

100: Semiconductor device
101: SiC substrate
102: n$^-$ Drift layer
103, 104: Shield region
105: Current spreading layer
110: First semiconductor layer
110A: First surface
110B: Second surface
111: n$^+$ Drift layer
112: Body layer
113: n$^+$ Source contact layer
114: p$^+$ Source contact layer
121: Trench
122: Gate insulating film
123: Gate electrode
124: Interlayer insulator
125: Opening
126: Barrier metal film
127, 128: Ohmic electrode
129: Source pad electrode
129A: Field plate portion
130: Passivation layer
151: Embedded JTE layer
152: JTE layer
152A: First JTE layer
152B: Second JTE layer
153: Guard ring layer
155: Second semiconductor layer
191: Element region
192: Terminating region
200: Semiconductor device
201: SiC substrate
203, 204: Shield region
205: Current spreading layer
206: n$^-$ Buffer layer
207: n$^+$ Drift layer
208: p Pillar
210: First semiconductor layer
210A: First surface
210B: Secondary surface 251: Embedded JTE layer
256: p Semiconductor layer
260: Super junction structure
291: Element region
292: Terminating region

The invention claimed is:

1. A semiconductor device comprising:
a first semiconductor layer that is a first conductivity type and includes an element region where a plurality of semiconductor elements are to be formed;
an annular second semiconductor layer that is a second conductivity type, formed to include a first surface of the first semiconductor layer, and surrounds the element region in a plan view;
a third semiconductor layer that is the second conductivity type, formed in the first semiconductor layer and separated more from the first surface than the second semiconductor layer, and sandwiches a portion of the first semiconductor layer between the second semiconductor layer and the third semiconductor layer;
a fourth semiconductor layer that is the second conductivity type and electrically connects the second semiconductor layer and the third semiconductor layer to each other; and
a first electrode electrically connected to the fourth semiconductor layer inside the second semiconductor layer in the plan view,
wherein an effective concentration of a second conductivity type impurity included in the second semiconductor layer is higher than an effective concentration of a first conductivity type impurity included in the first semiconductor layer, and
wherein an effective concentration of the second conductivity type impurity included in the third semiconductor layer is higher than the effective concentration of the second conductivity type impurity included in the second semiconductor layer.

2. The semiconductor device as claimed in claim 1, wherein the second semiconductor layer includes
a first annular layer that is electrically connected to the fourth semiconductor layer, and
a second annular layer that is formed at a position separated from the first annular layer and surrounds the first annular layer in the plan view.

3. The semiconductor device as claimed in claim 2, further comprising:
a SiC substrate that has a first principal surface, and a second principal surface on the opposite side from the first principal surface; and
a second electrode that is formed on the second principal surface,
wherein the first semiconductor layer is formed on the first principal surface.

4. The semiconductor device as claimed in claim 1, wherein, in the plan view, an outer edge of the third semiconductor layer is positioned on the side closer to the element region than an outer edge of the second semiconductor layer.

5. The semiconductor device as claimed in claim 4, further comprising:
a SiC substrate that has a first principal surface, and a second principal surface on the opposite side from the first principal surface; and
a second electrode that is formed on the second principal surface,
wherein the first semiconductor layer is formed on the first principal surface.

6. The semiconductor device as claimed in claim 1, further comprising:
a fifth semiconductor layer that is the second conductivity type and formed below the fourth semiconductor layer when the third semiconductor layer is positioned below the second semiconductor layer in the plan view viewed from above the second semiconductor layer,
wherein, in the plan view, an outer edge of the fifth semiconductor layer is positioned on the side closer to the element region than an outer edge of the fourth semiconductor layer.

7. The semiconductor device as claimed in claim 6, further comprising:
a SiC substrate that has a first principal surface, and a second principal surface on the opposite side from the first principal surface; and
a second electrode that is formed on the second principal surface,
wherein the first semiconductor layer is formed on the first principal surface.

8. The semiconductor device as claimed in claim 1, further comprising:
an insulating film that covers the first semiconductor layer,
wherein the first electrode includes a field plate portion covering a portion of the second semiconductor layer on the insulating film.

9. The semiconductor device as claimed in claim 8, wherein, when the third semiconductor layer is positioned below the second semiconductor layer in the plan view viewed from above the second semiconductor layer,
the second semiconductor layer includes
a first region that is positioned below an end portion of the field plate portion, and includes the second conductivity type impurity with a first effective concentration, and
a second region that is positioned on the side closer to an end portion of the second semiconductor layer than the first region, and includes the second conductivity type impurity with a second effective concentration lower than the first effective concentration.

10. The semiconductor device as claimed in claim 8, further comprising:
a SiC substrate that has a first principal surface, and a second principal surface on the opposite side from the first principal surface; and
a second electrode that is formed on the second principal surface,
wherein the first semiconductor layer is formed on the first principal surface.

11. The semiconductor device as claimed in claim 1, further comprising:
a SiC substrate that has a first principal surface, and a second principal surface on the opposite side from the first principal surface; and
a second electrode that is formed on the second principal surface,
wherein the first semiconductor layer is formed on the first principal surface.

12. A semiconductor device comprising:
a first semiconductor layer that is a first conductivity type and includes an element region where a plurality of semiconductor elements are to be formed;
an annular second semiconductor layer that is a second conductivity type, formed to include a first surface of the first semiconductor layer, and surrounds the element region in a plan view;
a third semiconductor layer that is the second conductivity type, formed in the first semiconductor layer and separated more from the first surface than the second semiconductor layer, and sandwiches a portion of the first semiconductor layer between the second semiconductor layer and the third semiconductor layer;
a fourth semiconductor layer that is the second conductivity type, and electrically connects the second semiconductor layer and the third semiconductor layer to each other;
a first electrode that is electrically connected to the fourth semiconductor layer inside the second semiconductor layer in the plan view; and
a plurality of columnar semiconductor layers that are the second conductivity type, formed in the first semiconductor layer, and form a super junction structure together with the first semiconductor layer,
wherein, in a plan view, an outer edge of the third semiconductor layer is positioned on the side closer to the element region than an outer edge of the second semiconductor layer,
wherein at least a portion of the plurality of columnar semiconductor layers is electrically connected to the third semiconductor layer,
wherein an effective concentration of a second conductivity type impurity included in the second semiconductor layer is higher than an effective concentration of a first conductivity type impurity included in the first semiconductor layer, and
wherein an effective concentration of the second conductivity type impurity included in the third semiconductor layer is higher than the effective concentration of the second conductivity type impurity included in the second semiconductor layer.

13. The semiconductor device as claimed in claim 12, wherein a portion of the plurality of columnar semiconductor layers is positioned outside the outer edge of the third semiconductor layer in the plan view, and is electrically independent of the third semiconductor layer.

14. The semiconductor device as claimed in claim 12, further comprising:
a SiC substrate that has a first principal surface, and a second principal surface on the opposite side from the first principal surface; and
a second electrode that is formed on the second principal surface,
wherein the first semiconductor layer is formed on the first principal surface.

15. A semiconductor device comprising:
an n-type drift layer that includes an element region where a plurality of semiconductor elements are to be formed;
an annular p-type junction termination extension layer that is formed to include a first surface of the drift layer, and surrounds the element region in a plan view;
a p-type guard ring layer that is formed to include the first surface of the drift layer, at a position separated from the junction termination extension layer, and surrounds the junction termination extension layer in the plan view;
a p-type embedded junction termination extension layer that is formed in the drift layer, at a position separated more from the first surface than the junction termination extension layer and the guard ring layer, and sandwiches a portion of the drift layer between the junction termination extension layer and the guard ring layer;
a p-type contact layer that electrically connects the junction termination extension layer and the embedded junction termination extension layer to each other;
a first electrode that is electrically connected to the contact layer inside the junction termination extension layer in the plan view;
a SiC substrate that has a first principal surface, and a second principal surface on the side opposite from the first principal surface; and
a second electrode that is formed on the second principal surface,
wherein the drift layer is formed on the first principal surface,
wherein, in the plan view, an outer edge of the embedded junction termination extension layer is positioned on the side closer to the element region than an outer edge of the guard ring layer,
wherein effective concentrations of acceptor impurities included in the junction termination extension layer and the guard ring layer are higher than an effective concentration of a donor impurity included in the drift layer, and
wherein an effective concentration of an acceptor impurity included in the embedded junction termination extension layer is higher than the effective concentrations of the acceptor impurities included in the junction termination extension layer and the guard ring layer.

* * * * *